United States Patent
Garcia et al.

(10) Patent No.: US 12,323,130 B2
(45) Date of Patent: Jun. 3, 2025

(54) TRANSVERSELY-EXCITED FILM BULK ACOUSTIC RESONATOR WITH CONTROLLED CONDUCTOR SIDEWALL ANGLES

(71) Applicant: Murata Manufacturing Co., Ltd., Nagaokakyo (JP)

(72) Inventors: Bryant Garcia, Burlingame, CA (US); Patrick Turner, San Bruno, CA (US); Robert Hammond, Santa Barbara, CA (US); Minefumi Ouchi, Nagaokakyo (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 257 days.

(21) Appl. No.: 17/975,749

(22) Filed: Oct. 28, 2022

(65) Prior Publication Data

US 2023/0051876 A1    Feb. 16, 2023

Related U.S. Application Data

(63) Continuation of application No. PCT/US2021/029649, filed on Apr. 28, 2021.
(Continued)

(51) Int. Cl.
*H03H 9/17* (2006.01)
*H03H 3/02* (2006.01)
(Continued)

(52) U.S. Cl.
CPC ............. *H03H 9/173* (2013.01); *H03H 3/02* (2013.01); *H03H 9/02015* (2013.01);
(Continued)

(58) Field of Classification Search
CPC ...... H03H 9/173; H03H 3/02; H03H 9/02015; H03H 9/132; H03H 9/174; H03H 9/605;
(Continued)

(56) References Cited

U.S. PATENT DOCUMENTS 9,093,979 B2 *   7/2015   Wang ..................... H10N 30/40
9,496,846 B2 *   11/2016   Iwasaki ............. H03H 9/02984
(Continued)

OTHER PUBLICATIONS

International Search Report in PCT/US2021/029649, mailed Aug. 6, 2021, 2 pages.

*Primary Examiner* — Andrea Lindgren Baltzell
*Assistant Examiner* — Kimberly E Glenn
(74) *Attorney, Agent, or Firm* — ArentFox Schiff LLP

(57) ABSTRACT

Acoustic resonator devices and methods are disclosed. An acoustic resonator device includes a piezoelectric plate having opposed front and back surfaces. A first electrode and a second electrode are formed on the front surface of the piezoelectric plate, the first and second electrodes and the piezoelectric plate configured such that a radio frequency signal applied between the first and second electrodes excites a shear primary acoustic mode in the piezoelectric plate. The first electrode and the second electrode have trapezoidal cross-sectional shapes. A sidewall angle of at least one side surface of the first electrode and a sidewall angle of at least one side surface of the second electrode are greater than or equal to 70 degrees and less than or equal to 110 degrees.

21 Claims, 19 Drawing Sheets

FIG. 2

Related U.S. Application Data

(60) Provisional application No. 63/017,104, filed on Apr. 29, 2020, provisional application No. 63/017,501, filed on Apr. 29, 2020.

(51) Int. Cl.
*H03H 9/02* (2006.01)
*H03H 9/13* (2006.01)
*H03H 9/60* (2006.01)

(52) U.S. Cl.
CPC ............ *H03H 9/132* (2013.01); *H03H 9/174* (2013.01); *H03H 9/605* (2013.01); *H03H 2003/021* (2013.01); *H03H 2003/023* (2013.01)

(58) Field of Classification Search
CPC ....... H03H 2003/021; H03H 2003/023; H03H 9/568; H03H 2003/025; H03H 9/02228; H03H 9/175; H03H 9/02157
See application file for complete search history.

(56) References Cited

U.S. PATENT DOCUMENTS

| | | |
|---|---|---|
| 10,637,438 B2 | 4/2020 | Garcia et al. |
| 2004/0070313 A1 | 4/2004 | Furukawa et al. |
| 2008/0179989 A1 | 7/2008 | Ogami et al. |
| 2014/0285063 A1 | 9/2014 | Obata et al. |
| 2019/0386637 A1 | 12/2019 | Plesski et al. |
| 2021/0044272 A1* | 2/2021 | Yantchev ........... H03H 9/02228 |

* cited by examiner

TRANSVERSELY-EXCITED FILM BULK ACOUSTIC RESONATOR WITH CONTROLLED CONDUCTOR SIDEWALL ANGLES

CROSS REFERENCE TO RELATED APPLICATIONS

The current application is a continuation of U.S. International Application No. PCT/US2021/029649, filed Apr. 28, 2021, entitled "Transversely-Excited Film Bulk Acoustic Resonator with Controlled Conductor Side-Wall Angles," which claims priority to U.S. Patent Provisional No. 63/017,104, filed Apr. 29, 2020, and U.S. Patent Provisional No. 63/017,501, also filed Apr. 29, 2020, the contents of each of where are hereby incorporated by reference in their entirety.

TECHNICAL FIELD

This disclosure relates to radio frequency filters using acoustic wave resonators, and specifically to filters for use in communications equipment.

BACKGROUND

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

SUMMARY OF THE INVENTION

Thus, according to an exemplary aspect, an acoustic resonator device is provided that includes a piezoelectric plate having opposing first and second surfaces; and a first electrode and a second electrode disposed on the first surface of the piezoelectric plate, the first and second electrodes and the piezoelectric plate configured such that a radio frequency signal applied between the first and second electrodes excites a shear primary acoustic mode in the piezoelectric plate. Moreover, the first electrode and the second electrode each have trapezoidal cross-sectional shapes, and a sidewall angle of at least one side surface of the first electrode and a sidewall angle of at least one side surface of the second electrode are greater than or equal to 70 degrees and less than or equal to 110 degrees relative to the first surface of the piezoelectric plate.

In another exemplary aspect, an acoustic resonator device is provided that includes a piezoelectric plate having opposed first and second surfaces; and an interdigital transducer (IDT) disposed on the first surface of the piezoelectric plate and that includes first and second busbars, a first plurality of IDT fingers extending from the first busbar, and a second plurality of IDT fingers extending from the second busbar and interleaved with the first plurality of fingers. In this exemplary aspect, the first plurality of IDT fingers and the second plurality of IDT fingers have trapezoidal cross-sectional shapes with sidewall angles greater than or equal to 70 degrees and less or equal to 110 degrees relative to the first surface of the piezoelectric plate.

In yet another exemplary aspect, a method of fabricating an acoustic resonator device is provided that includes depositing a conductor layer on a front surface of a piezoelectric plate having opposed first and second surfaces; and patterning the conductor layer to form interleaved fingers of an interdigital transducer (IDT), the IDT and the piezoelectric plate configured such that a radio frequency signal applied between the first and second busbars excites a shear primary acoustic mode in the piezoelectric plate. In this aspect, patterning the conductor layer comprises controlling sidewall angles of the interleaved fingers such that the interleaved fingers and trapezoidal cross-sectional shapes with sidewall angles greater than or equal to 70 degrees and less than or equal to 110 degrees relative to the first surface of the piezoelectric plate.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
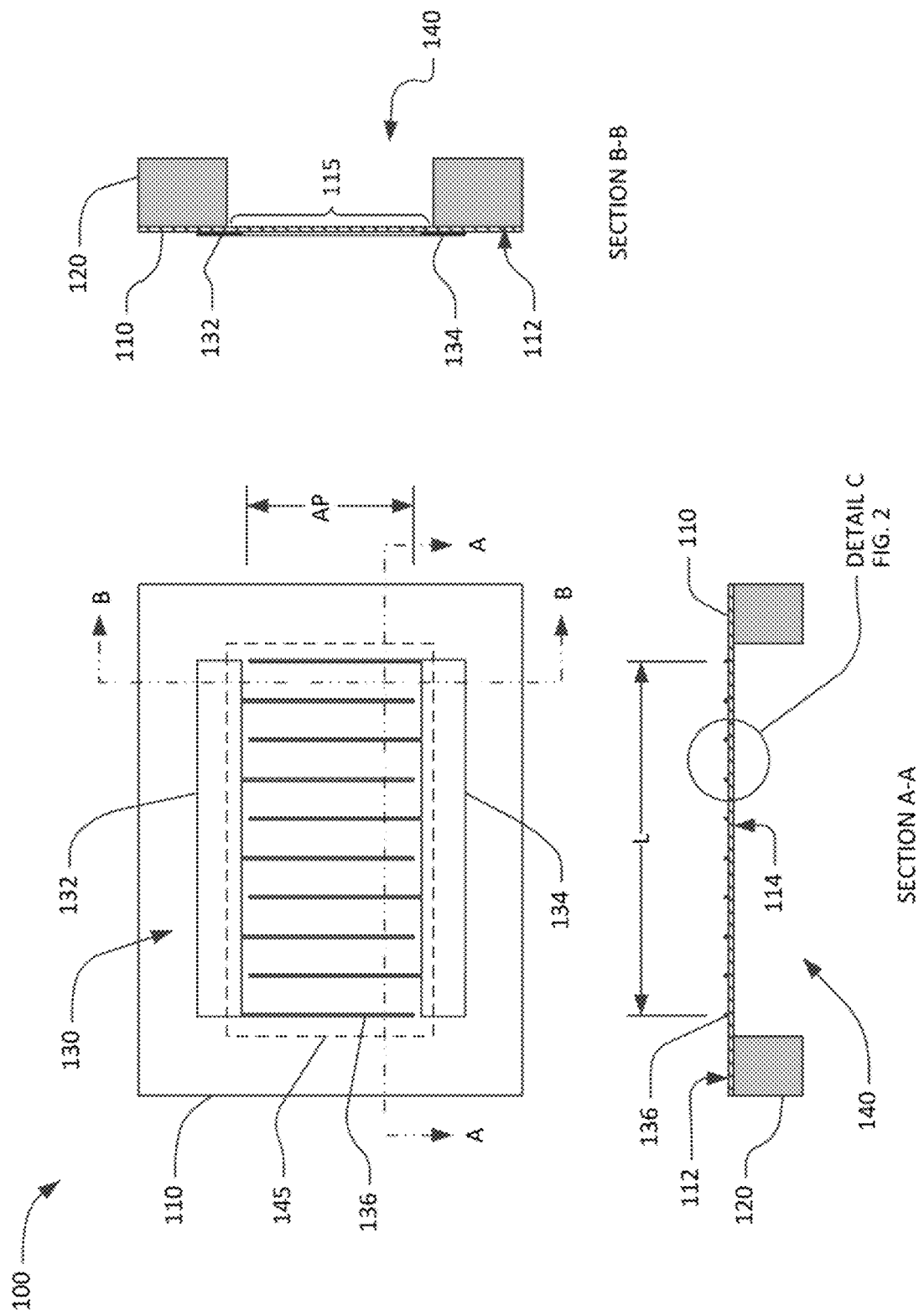
FIG. 1 is schematic plan view and two schematic cross-sectional views of a transversely-excited film bulk acoustic resonator (XBAR) according to an exemplary aspect.

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

In an exemplary aspect, the XBAR 100 comprises a thin film conductor pattern formed on a surface of a piezoelectric plate 110 having a front surface 112 (e.g., a first surface) and a back surface 114 (e.g., a second surface). The first and second surfaces oppose each other and are essentially parallel. For purposes of this disclosure, "essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be, for example, Z-cut, rotated ZY-cut and rotated YX-cut.

The back surface 114 of the piezoelectric plate 110 is attached to a surface of the substrate 120 except for a portion of the piezoelectric plate 110 that forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item".

The substrate 120 provides mechanical support to the piezoelectric plate 110. The substrate 120 may be, for example, silicon, sapphire, quartz, or some other material or combination of materials. The back surface 114 of the piezoelectric plate 110 may be attached to the substrate 120 using a wafer bonding process. Alternatively, the piezoelectric plate 110 may be grown on the substrate 120 or otherwise attached to the substrate. The piezoelectric plate 110 may be attached directly to the substrate or may be attached to the substrate 120 via one or more intermediate material layers.

The cavity 140 is an empty space within a solid body of the resonator 100. The cavity 140 may be a hole completely through the substrate 120 (as shown in Section A-A and Section B-B) or a recess in the substrate 120. The cavity 140 may be formed, for example, by selective etching of the substrate 120 before or after the piezoelectric plate 110 and the substrate 120 are attached. In an exemplary aspect, a dielectric layer (e.g., silicon dioxide) can be formed on the substrate 120 with the cavity being formed directly in the dielectric layer.

The conductor pattern of the XBAR 100 includes an interdigital transducer (IDT) 130. An IDT is an electrode structure for converting between electrical and acoustic energy in piezoelectric devices. The IDT 130 includes a first plurality of parallel elongated conductors, commonly called "fingers", such as finger 136, extending from a first busbar 132. The IDT 130 includes a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

For purposes of this disclosure, the term "busbar" refers to the conductors that interconnect the first and second sets of fingers in an IDT. As shown in FIG. 1, each busbar 132, 134 is an elongated rectangular conductor with a long axis orthogonal to the interleaved fingers and having a length approximately equal to the length L of the IDT. The busbars of an IDT need not be rectangular or orthogonal to the interleaved fingers and may have lengths longer than the length of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have more than ten parallel fingers in the IDT 110. An XBAR may have dozens, possibly hundreds, of parallel fingers in the IDT 110. Similarly, the thickness of the piezoelectric plate and IDT fingers are greatly exaggerated in the cross-sectional views.

Figure 2:
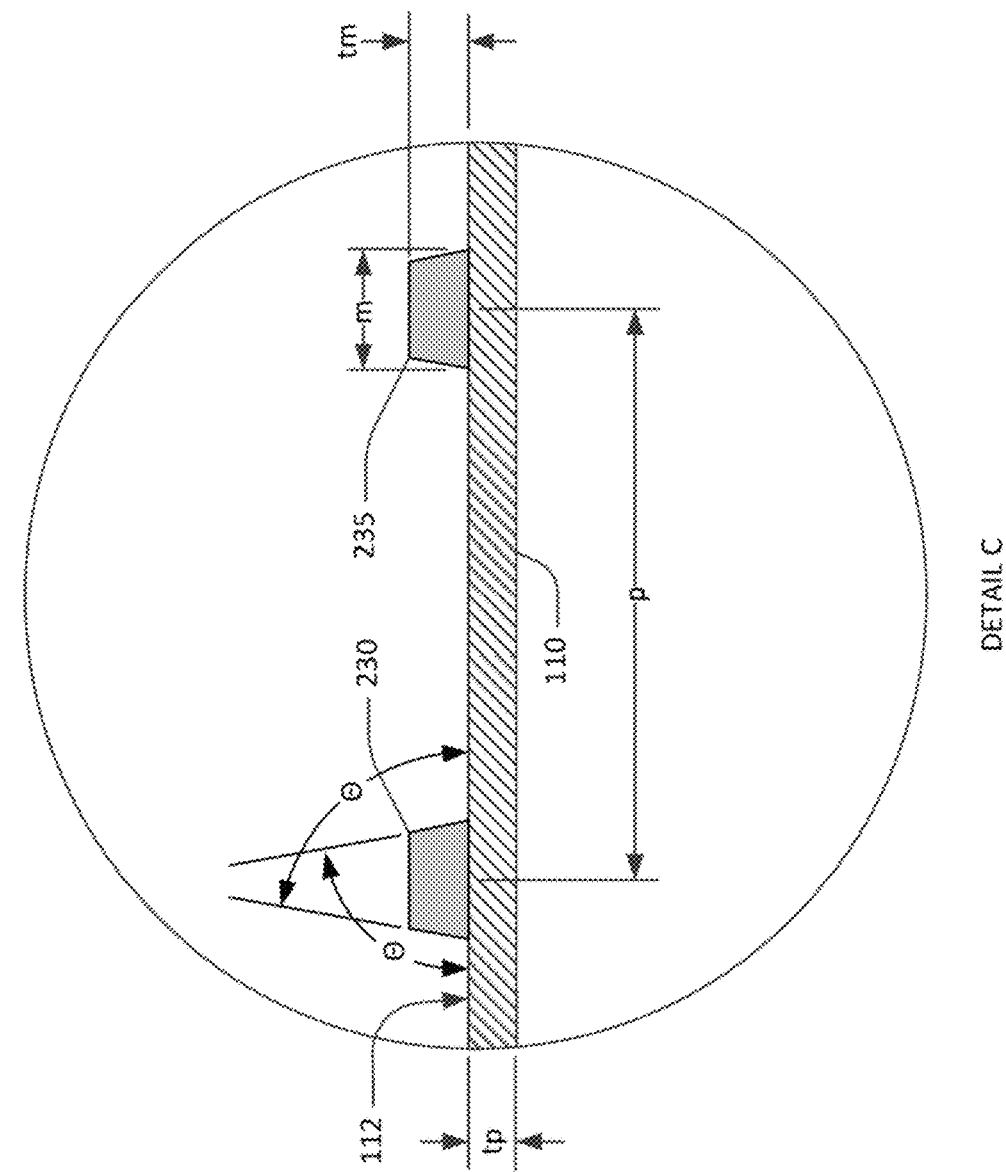
FIG. 2 is an expanded schematic cross-sectional view of a portion of the XBAR of FIG. 1 according to an exemplary aspect.

FIG. 2 shows a detailed schematic cross-sectional view of the XBAR 100. The piezoelectric plate 110 is a single-crystal layer of piezoelectrical material having a thickness tp. tp may be, for example, 100 nm to 1500 nm. When used in filters for communications bands from 3.4 GHZ to 6 GHz, the thickness tp may be, for example, 200 nm to 1000 nm.

The IDT fingers 230, 235 may be one or more layers of aluminum, a substantially aluminum alloys, copper, a substantially copper alloys, beryllium, gold, molybdenum, or some other conductive material. Thin (relative to the total thickness of the conductors) layers of other metals, such as chromium or titanium, may be formed under and/or over the fingers 230, 235 to improve adhesion between the fingers and the piezoelectric plate 110 and/or to passivate or encapsulate the fingers. The busbars (132, 134 in FIG. 1) of the IDT may be made of the same or different materials as the fingers.

For purposes of this disclosure, dimension p is the center-to-center spacing or "pitch" of the IDT fingers, which may be referred to as the pitch of the IDT and/or the pitch of the XBAR. Moreover, dimension m is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2 to 20 times the width m of the fingers. In addition, the pitch p of the IDT is typically 2 to 20 times the thickness tp of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography.

The thickness tm of the IDT fingers 230, 235 may be from 100 nm to about equal to the width w. The thickness of the busbars (132, 134 in FIG. 1) of the IDT may be the same as, or greater than, the thickness tm of the IDT fingers. For XBARs intended for high power applications, the thickness tm may be greater than 0.85 times the thickness tp of the piezoelectric plate 110, as described in U.S. Pat. No. 10,637,438.

As shown in FIG. 2, the IDT fingers 230, 235 have trapezoidal (or substantially trapezoidal) cross-sections according to an exemplary aspect. For purposes of this disclosure, the term "substantially trapezoidal" means a generally trapezoidal shape that takes into account minor variations in the structure due to manufacturing variations, for example. Moreover, in the exemplary aspect, the angle between a side of a thin film conductor and the surface on which the conductor is formed is commonly referred to as a "sidewall angle" of the conductor. In FIG. 2, the angles $\theta$ are the sidewall angles of IDT finger 230. In the exemplary aspect, the sidewall angle is defined as an internal angle within the conductor such that the two sidewall angles of the IDT finger 230 are 80 degrees, although the two sides actually tilt in opposite directions. A conductor with 90-degree sidewall angles has a rectangular cross-section. A conductor with equal sidewall angles other than 90 degrees will have a trapezoidal cross-section. When the sidewall angles are less than 90 degrees, the broader face of the trapezoid will face the surface on which the conductor is formed, as shown in FIG. 2. When the sidewall angles are greater than 90 degrees, the narrower face of the trapezoid will face the surface on which the conductor is formed (not shown). The two sidewall angles of a conductor are not necessarily equal. When the sidewall angles are not equal, the cross-section of the conductor will be an irregular trapezoid (not shown).

In FIG. 2, the IDT fingers 230, 235 are shown as single layer structures which may be aluminum or some other metal. IDT fingers may include multiple layers of materials. For example, a thin adhesion layer of another material, such as titanium or chrome, may be formed between the IDT fingers 230, 235 and the piezoelectric plate 110. When an adhesion layer is present, the sidewall angles of the adhesion layer are not necessarily the same as the sidewall angles θ.

Here, the IDT finger 230 is an example of "first electrode" and the IDT finger 235 is an example of "second electrode". As was shown in FIG. 1, a plurality of first electrodes is connected to the first bus bar 132. A plurality of second electrodes is connected to the second bus bar 134. The plurality of first electrodes and the plurality of second electrodes are interleaved.

Figure 3:
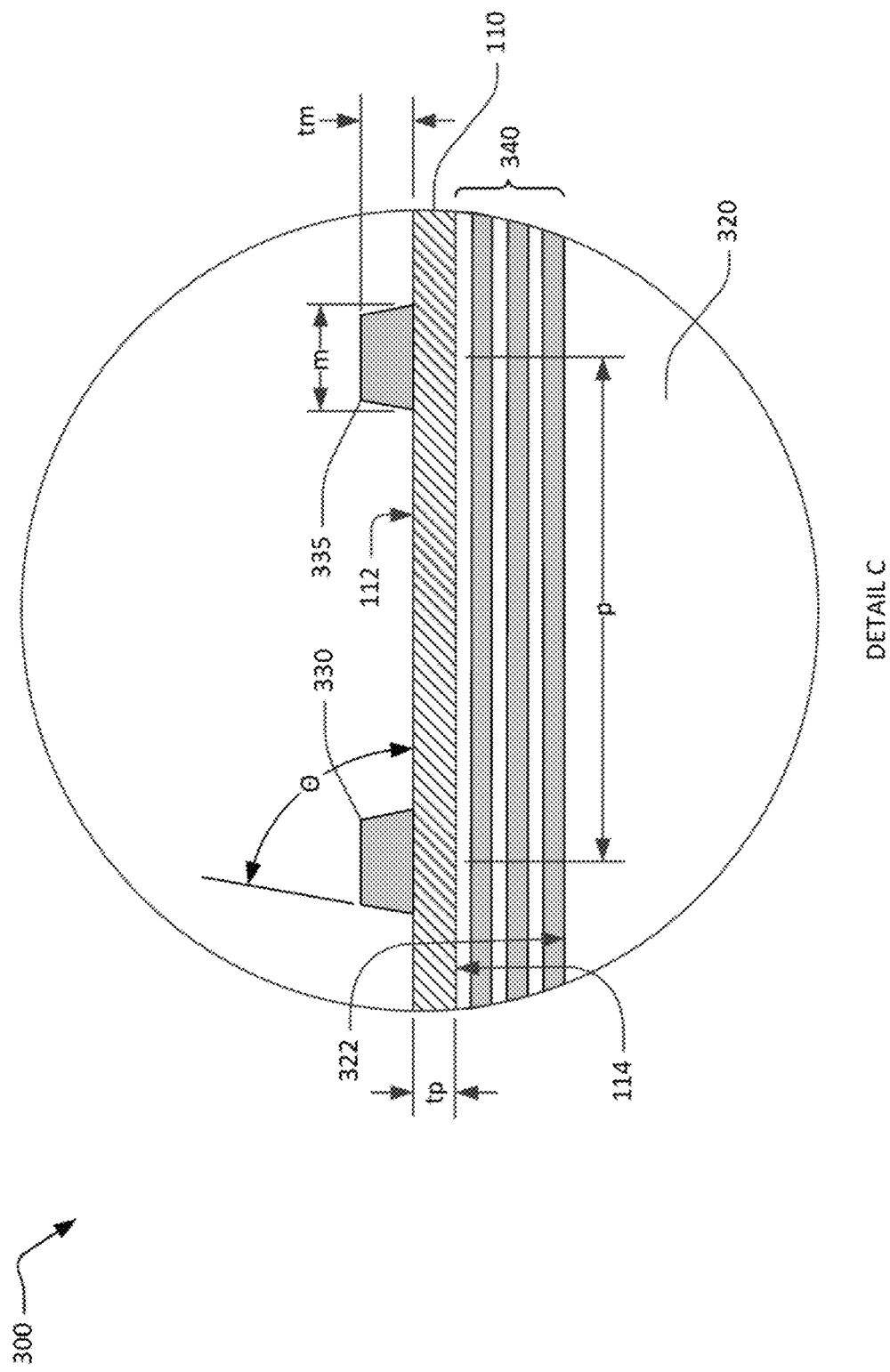
FIG. 3 is an alternative schematic cross-sectional view of the XBAR of FIG. 1 according to an exemplary aspect.

FIG. 3 shows a detailed schematic cross-sectional view of a solidly mounted XBAR (SM XBAR) 300. SM XBARs are first described in U.S. Pat. No. 10,601,392, which is herein incorporated by reference. The SM XBAR 300 includes a piezoelectric plate 110 and an IDT (of which only fingers 330 and 335 are visible). The piezoelectric layer 110 has parallel front and back surfaces 112, 114. Dimension tp is the thickness of the piezoelectric plate 110. The width of the IDT fingers 330, 335 is dimension m, thickness of the IDT fingers is dimension tm, and the IDT pitch is dimension p.

In contrast to the XBAR devices shown in FIG. 1 and FIG. 2, the IDT of an SM XBAR is not formed on a diaphragm spanning a cavity in a substrate (120 in FIG. 1). Instead, an acoustic Bragg reflector 340 is sandwiched between a surface 322 of a substrate 320 and the back surface 114 of the piezoelectric plate 110. The term "sandwiched" means the acoustic Bragg reflector 340 is both disposed between and mechanically attached to a surface 322 of the substrate 320 and the back surface 114 of the piezoelectric plate 110. In some circumstances, thin layers of additional materials may be disposed between the acoustic Bragg reflector 340 and the surface 322 of the substrate 320 and/or between the Bragg reflector 340 and the back surface 114 of the piezoelectric plate 110. Such additional material layers may be present, for example, to facilitate bonding the piezoelectric plate 110, the acoustic Bragg reflector 340, and the substrate 320.

The acoustic Bragg reflector 340 includes multiple dielectric layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. As will be discussed subsequently, the primary acoustic mode in the piezoelectric plate of an XBAR is a shear bulk wave. Each of the layers of the acoustic Bragg reflector 340 has a thickness equal to, or about, one-fourth of the wavelength of a shear bulk wave having the same polarization as the primary acoustic mode at or near a resonance frequency of the SM XBAR 300. Dielectric materials having comparatively low acoustic impedance include silicon dioxide, carbon-containing silicon oxide, and certain plastics such as cross-linked polyphenylene polymers. Materials having comparatively high acoustic impedance include hafnium oxide, silicon nitride, aluminum nitride, silicon carbide, and diamond. All of the high acoustic impedance layers of the acoustic Bragg reflector 340 are not necessarily the same material, and all of the low acoustic impedance layers are not necessarily the same material. In the example of FIG. 3, the acoustic Bragg reflector 340 has a total of six layers. An acoustic Bragg reflector may have more than, or less than, six layers.

Figure 4:
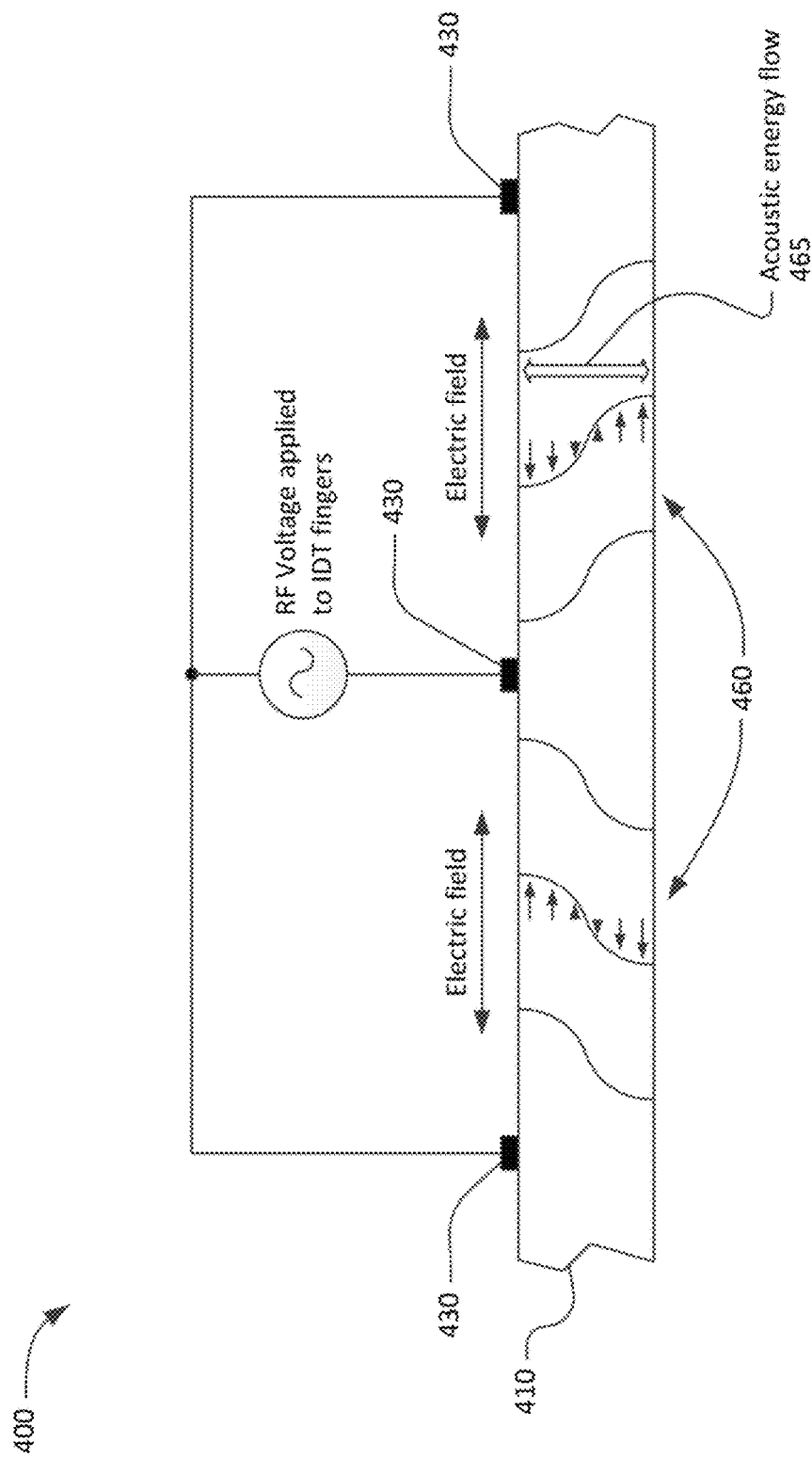
FIG. 4 is a graphic illustrating a shear primary acoustic mode in an XBAR according to an exemplary aspect.

FIG. 4 is a more detailed graphical illustration of the primary acoustic mode of interest in an XBAR. In particular, FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

Figure 5:
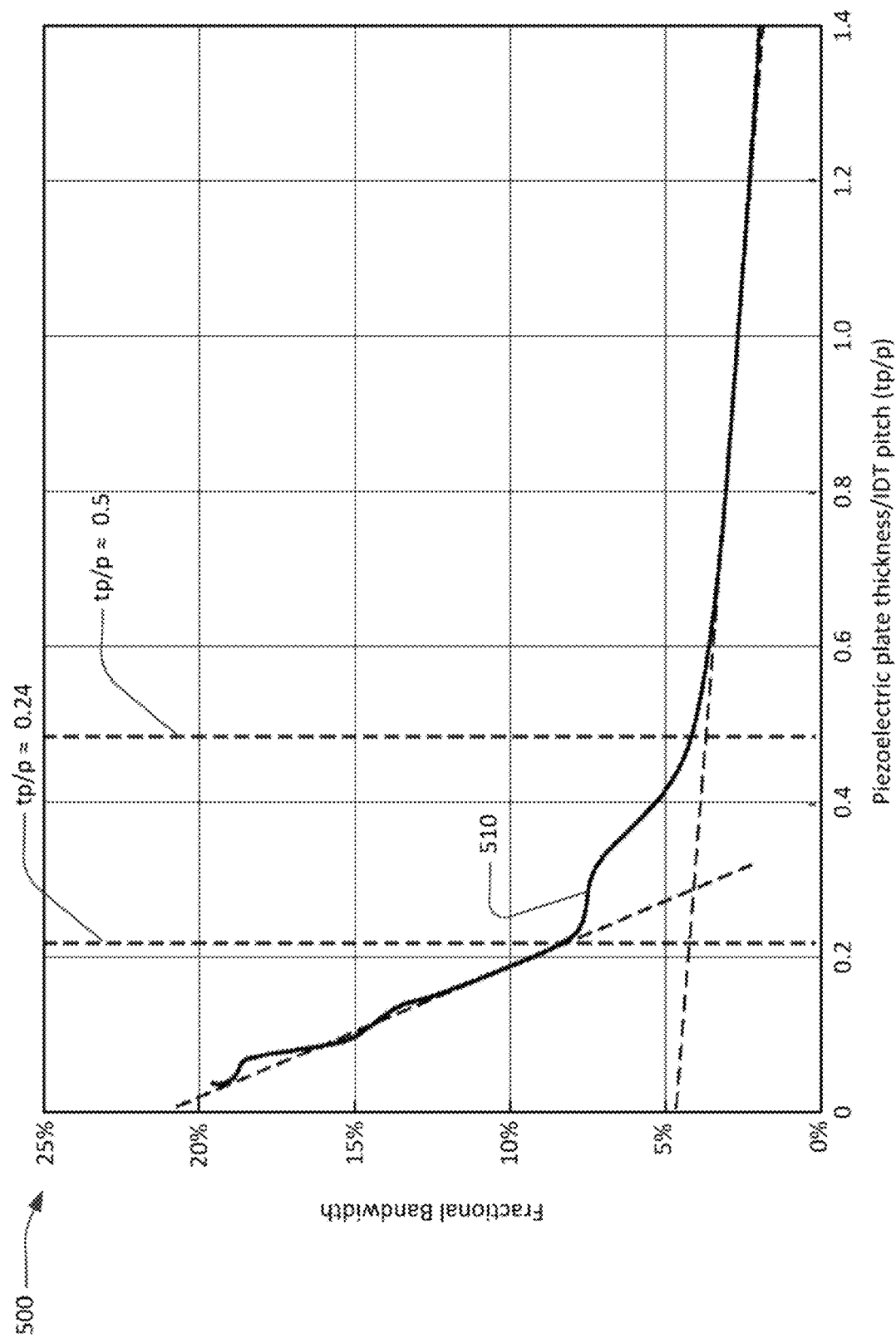
FIG. 5 is a graph of fractional bandwidth as a function of the ratio of piezoelectric plate thickness to interdigital transducer (IDT) pitch according to an exemplary aspect.

FIG. 5 is a diagram 500 showing a relationship between the structure of an acoustic wave resonators and its fractional bandwidth. Specifically, the solid curve 510 is a plot of the fractional bandwidth of an acoustic wave resonator as a function of tp/p (the ratio of the piezoelectric plate thickness to IDT pitch). As is apparent from FIG. 5, when tp/p exceeds 0.5, the fractional bandwidth is less than 5% even if tp/p is adjusted. On the other hand, in the case of tp/p≤0.5, if tp/p is changed within this range, a resonator having a high fractional bandwidth ≥5% can be constructed. When tp/p is 0.24 or less, the fractional bandwidth can be increased to 7% or more. In addition, if tp/p is adjusted within this range, a resonator having a higher coupling coefficient can be realized. Therefore, it is understood that a resonator having a high coupling coefficient using a shear bulk mode can be constituted by setting tp/p to 0.24 or less.

According to an exemplary aspect, the IDT of a resonator has at least one pair of electrodes and may have a large plurality of electrodes. In the case of a single pair of electrodes, p is the distance between the centers of the adjacent electrodes (230, 235 in FIG. 2). In the case of more than two electrodes, p is the average distance between the centers of the adjacent electrodes. When the piezoelectric plate has thickness variation, tp is an average thickness of the piezoelectric layer over the area of the IDT.

Figure 6:
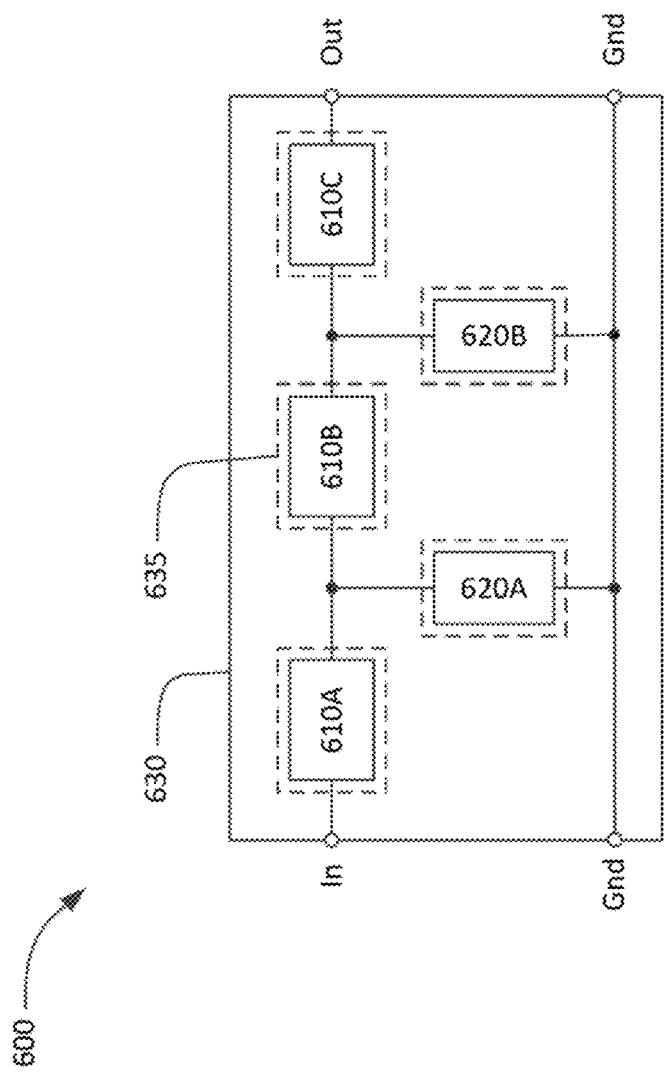
FIG. 6 is a schematic block diagram of a filter using XBARs according to an exemplary aspect.

FIG. 6 is a schematic circuit diagram for a high frequency band-pass filter 600 using XBARs. The filter 600 has a conventional ladder filter architecture including three series resonators 610A, 610B, 610C and two shunt resonators 620A, 620B. The three series resonators 610A, 610B, and 610C are connected in series between a first port and a second port (hence the term "series resonator"). In FIG. 6, the first and second ports are labeled "In" and "Out", respectively. However, the filter 600 is bidirectional and either port may serve as the input or output of the filter. The two shunt resonators 620A, 620B are connected from nodes between the series resonators to ground. A filter may contain additional reactive components, such as inductors, not shown in FIG. 6. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 600, the three series resonators 610A, B, C and the two shunt resonators 620A, B of the filter 600 are formed on a single plate 630 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 6, the cavities are illustrated schematically as the dashed rectangles (such as the rectangle 635). In this example, each IDT is disposed over a respective cavity. In other filters, the IDTs of two or more resonators may be disposed over a single cavity.

Each of the resonators 610A, 610B, 610C, 620A, 620B in the filter 600 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 600. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's pass-band and the anti-resonance frequencies of the series resonators are position above the upper edge of the pass-band.

Figure 7:
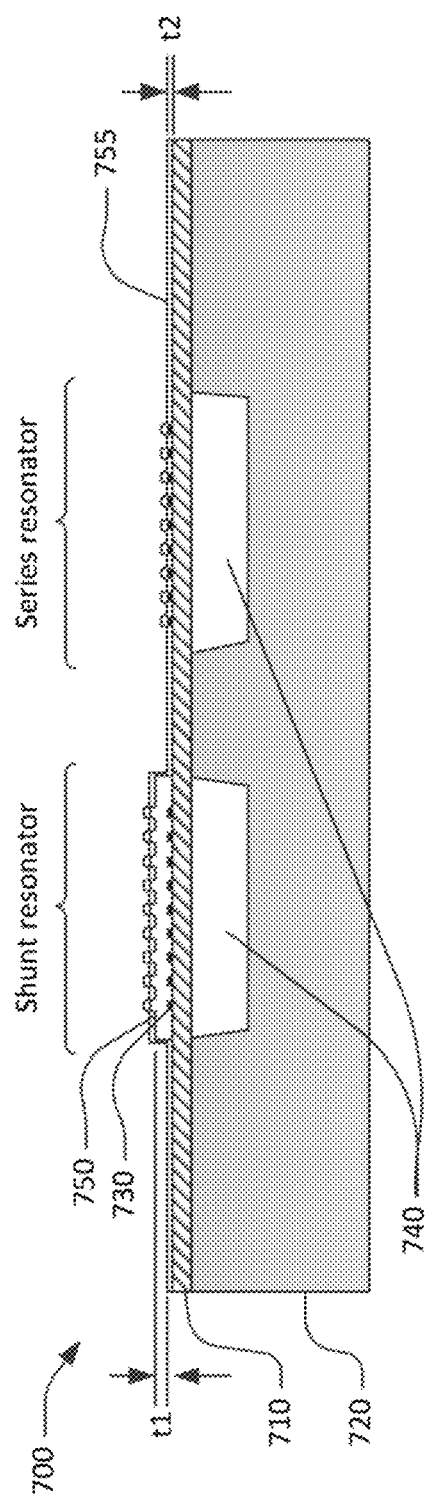
FIG. 7 is a schematic cross-sectional view of two XBARs illustrating a frequency-setting dielectric layer according to an exemplary aspect.

FIG. 7 is a schematic cross-sectional view through a shunt resonator and a series resonator of a filter 700 that uses a dielectric frequency setting layer to separate the resonance frequencies of shunt and series resonators. As shown, a piezoelectric plate 710 is attached to a substrate 720. Portions of the piezoelectric plate 710 form diaphragms spanning cavities 740 in the substrate 720. Interleaved IDT fingers, such as finger 730, are formed on the diaphragms. A first dielectric layer 750, having a thickness t1, is formed over the IDT of the shunt resonator. The first dielectric layer 750 is considered a "frequency setting layer", which is a layer of dielectric material applied to a first subset of the resonators in a filter to offset the resonance frequencies of the first subset of resonators with respect to the resonance frequencies of resonators that do not receive the dielectric frequency setting layer. The dielectric frequency setting layer is commonly $SiO_2$ but may be silicon nitride, aluminum oxide, or some other dielectric material. The dielectric frequency setting layer may be a laminate or composite of two or more dielectric materials.

A second dielectric layer 755, having a thickness t2, may be deposited over both the shunt and series resonator. The second dielectric layer 755 serves to seal and passivate the surface of the filter 700. The second dielectric layer may be the same material as the first dielectric layer or a different material. The second dielectric layer may be a laminate or composite of two or more different dielectric materials. Further, as will be described subsequently, the thickness of the second dielectric layer may be locally adjusted to fine-tune the frequency of the filter 700. Thus, the second dielectric layer can be referred to as the "passivation and tuning layer".

The resonance frequency of an XBAR is roughly proportional to the inverse of the total thickness of the diaphragm including the piezoelectric plate 710 and the dielectric layers 750, 755. The diaphragm of the shunt resonator is thicker than the diaphragm of the series resonator by the thickness t1 of the dielectric frequency setting layer 750. Thus, the shunt resonator will have a lower resonance frequency than the series resonator. The difference in resonance frequency between series and shunt resonators is determined by the thickness t1.

Figure 8:
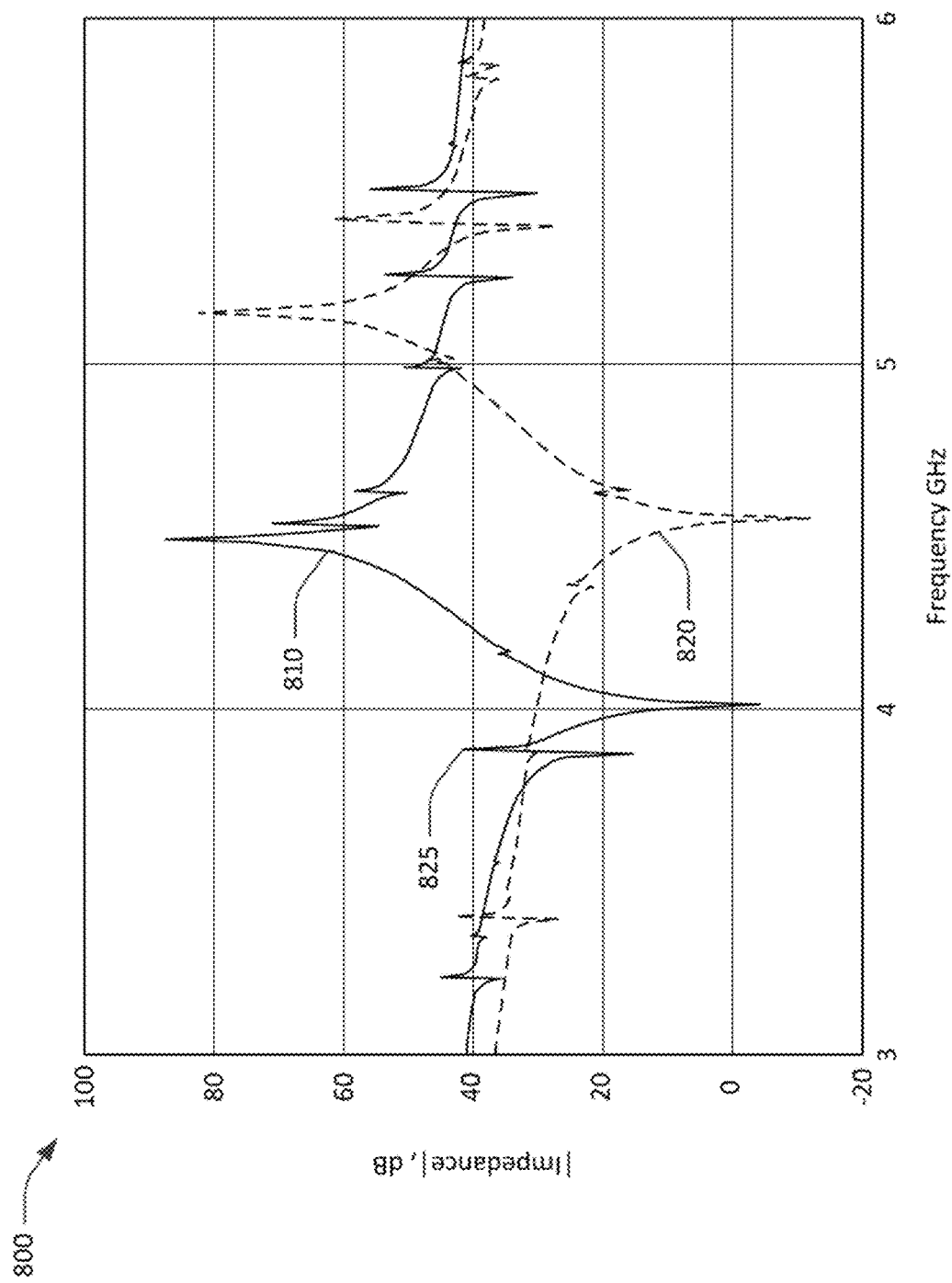
FIG. 8 is a graph of the impedance of an exemplary XBAR as a function of frequency according to an exemplary aspect.

FIG. 8 is a graph 800 of the magnitude of the impedance versus frequency for two representative XBARs. Specifically, the solid line 810 is a plot of the impedance of a shunt resonator in a ladder filter circuit, such as the ladder filter circuit of FIG. 5. This resonator has very low impedance at a resonance frequency about 4 GHz and very high impedance at an anti-resonance frequency about 4.5 GHz. The dashed line 920 is a plot of the impedance of a series resonator in the ladder filter circuit. According to the exemplary aspect, this resonator has very low impedance at a resonance frequency about 4.6 GHz and very high impedance at an anti-resonance frequency about 5.2 GHz. Both the shunt resonator and the series resonator shown in FIG. 8 have IDT fingers with trapezoidal cross-sections whose side wall angle θ is set to 70° or more as described below. Both XBARs exhibit spurious resonances at other frequencies.

Spurious modes located between the resonance frequency of the shunt resonator and the anti-resonance frequency of the series resonator may introduce unacceptable ripples in the filter pass-band. The frequency of spurious modes may be controlled and the amplitude of spurious modes may be suppressed by appropriate selection of the duty factor, or mark/pitch ratio, of the IDT fingers in a range from 0.1 to 0.4.

Figure 9:
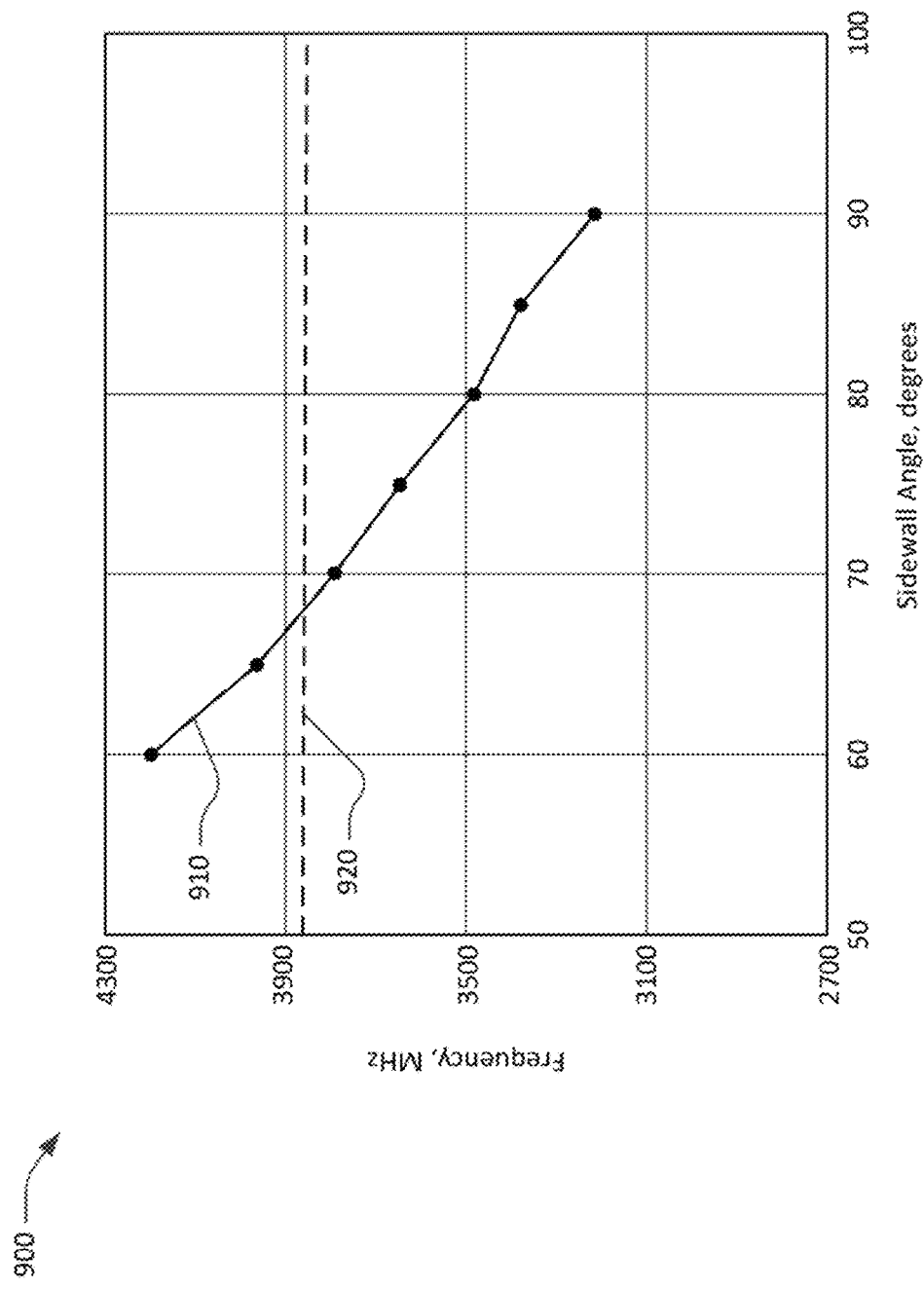
FIG. 9 is a graph of the frequency of a spurious mode as a function of sidewall angle according to an exemplary aspect.

The frequency of spurious modes is also affected by the sidewall angle of the IDT fingers. FIG. 9 is a diagram showing the relationship 910 between sidewall angle θ and the frequency of a significant spurious mode (825 in FIG. 8) for an exemplary XBAR. The exemplary XBAR includes a 127.5° YX cut lithium niobate piezoelectric plate with aluminum IDT electrodes. The thickness of the piezoelectric plate and the aluminum electrodes are both 500 nm. The substrate is silicon with a silicon dioxide film 1 um thick between the piezoelectric plate and the substrate. The resonance frequency of the XBAR is about 3880 MHz, as indicated by the dashed line 920.

The solid line 910 is a plot of the frequency of the spurious mode as a function of the sidewall angle of the IDT electrodes. When the sidewall angle θ is set to 70° or more, the frequency of the spurious mode is lower than the resonance frequency of 3880 MHz. A sidewall angle greater than or equal to 70 degrees is particularly beneficial for a shunt resonator in a ladder filter since the spurious mode is at a frequency below the passband of the filter. Reducing the sidewall angle below of 70 degrees causes the spurious mode to move through the resonance frequency.

The sidewall angle θ may be greater than 90 degrees. However, if the inclination angle θ is too large, problem arise in the manufacturability of the IDT fingers. Therefore, the upper limit of the inclination angle θ may be set to 110° in an exemplary aspect. In addition, m/p (the ratio of IDT finger width to IDT pitch) may be set greater than or equal to 0.12. In such case, resonant characteristic of the resonator may not be degraded.

U.S. Pat. No. 10,637,438, herein incorporated by reference, describes XBAR resonators for use in high power applications. In such applications, a small amount of power is dissipated in each XBAR due to resistive losses in the IDT fingers and acoustic losses in the IDT fingers and the diaphragm. The primary means of removing heat from the XBAR diaphragm is thermal conduction through the IDT fingers and busbars. To minimize resistive losses and improve heat removal, the IDT conductors are typically as thick or thicker than the diaphragm. For example, an XBAR with a diaphragm thickness of 400 nm may have 500 nm thick conductors.

Moreover, U.S. Pat. No. 10,637,438 describes the use of a figure of merit (FOM) to define a design space (i.e., combinations of IDT conductor thickness, pitch, and width) that provides XBARs with acceptable performance for use in filters. The FOM is calculated by integrating the negative impact of spurious modes across a defined frequency range. For each combination of IDT conductor thickness and pitch, the FOM is calculated for a range of IDT finger widths. The minimum FOM value over the range of IDT finger widths is considered the minimized FOM for that conductor thickness/pitch combination. The definition of the FOM and the frequency range depend on the requirements of a particular target filter. The frequency range typically includes the pass-band of the target filter and may include one or more stop bands. Spurious modes occurring between the resonance and anti-resonance frequencies of each hypothetical resonator may be accorded a heavier weight in the FOM than spurious modes at frequencies below resonance or above anti-resonance. Hypothetical resonators having a minimized FOM below a threshold value were considered potentially "useable", which is to say probably having sufficiently low spurious modes for use in the target filter. Hypothetical resonators having a minimized cost function above the threshold value were considered not useable.

Figure 10:
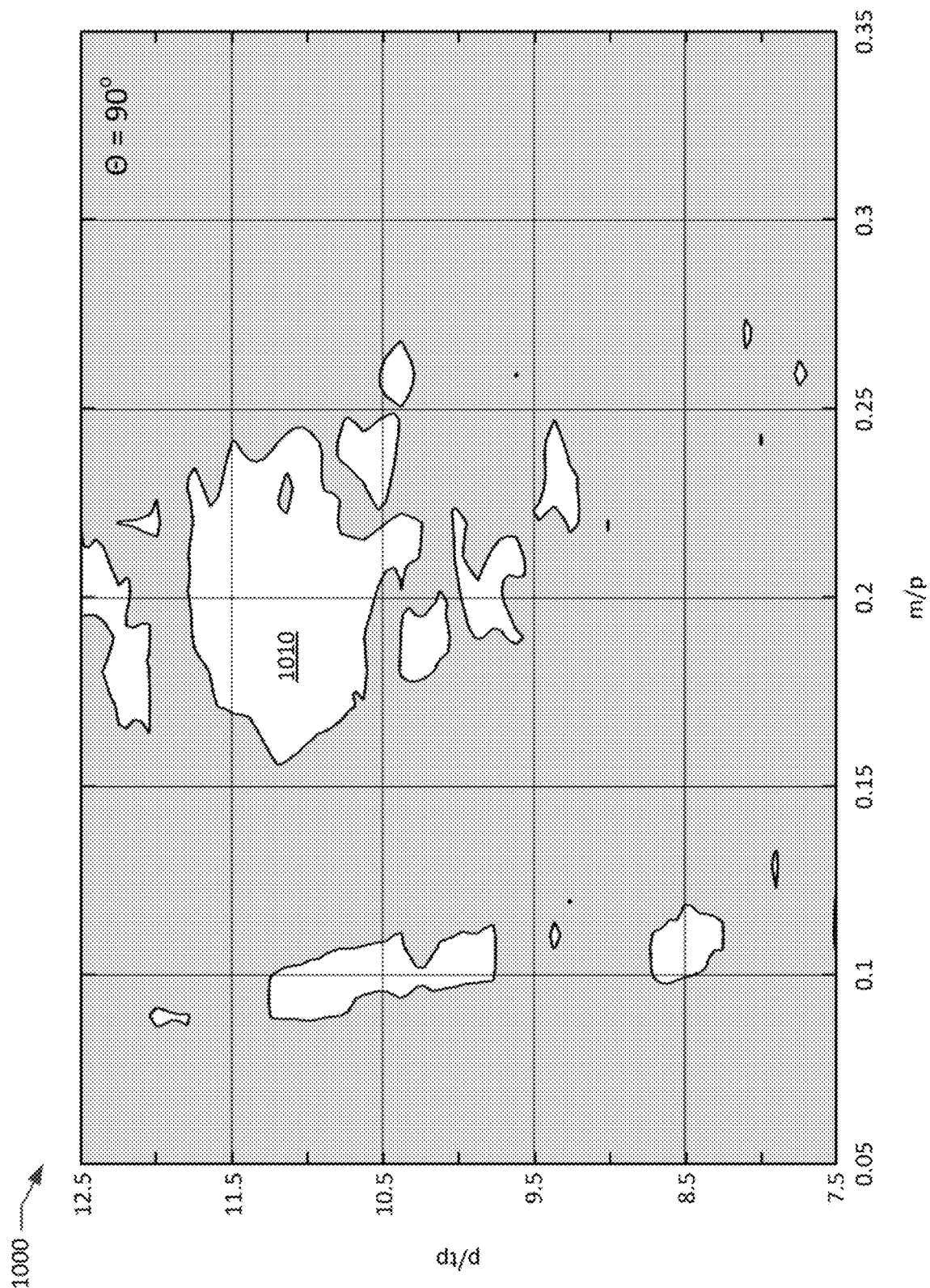
FIG. 10 is a graph identifying preferred combinations of mark and pitch for IDT electrodes with 90° sidewall angles according to an exemplary aspect.
Figure 11:
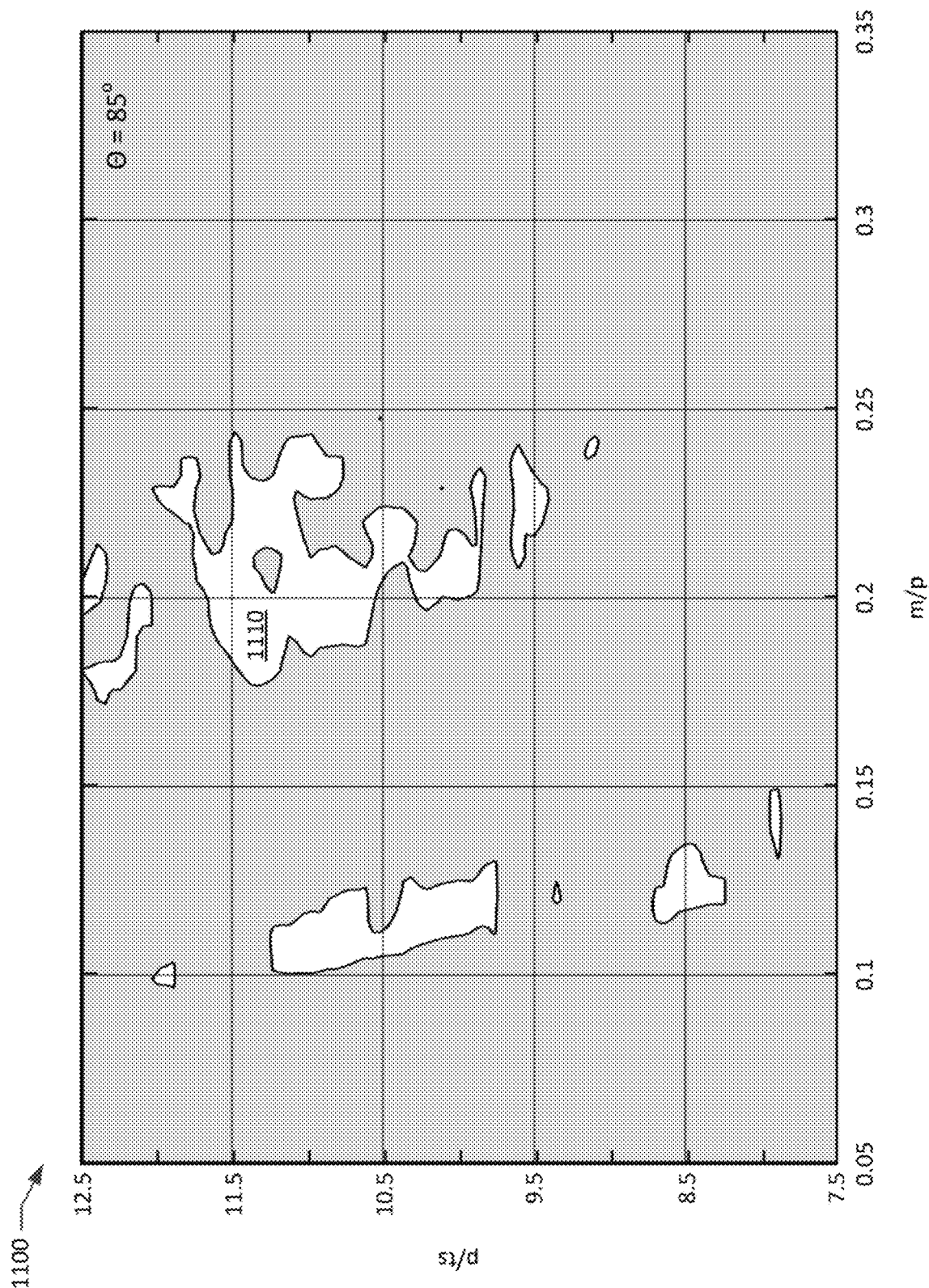
FIG. 11 is a graph identifying preferred combinations of mark and pitch for IDT electrodes with 85° sidewall angles according to an exemplary aspect.
Figure 12:
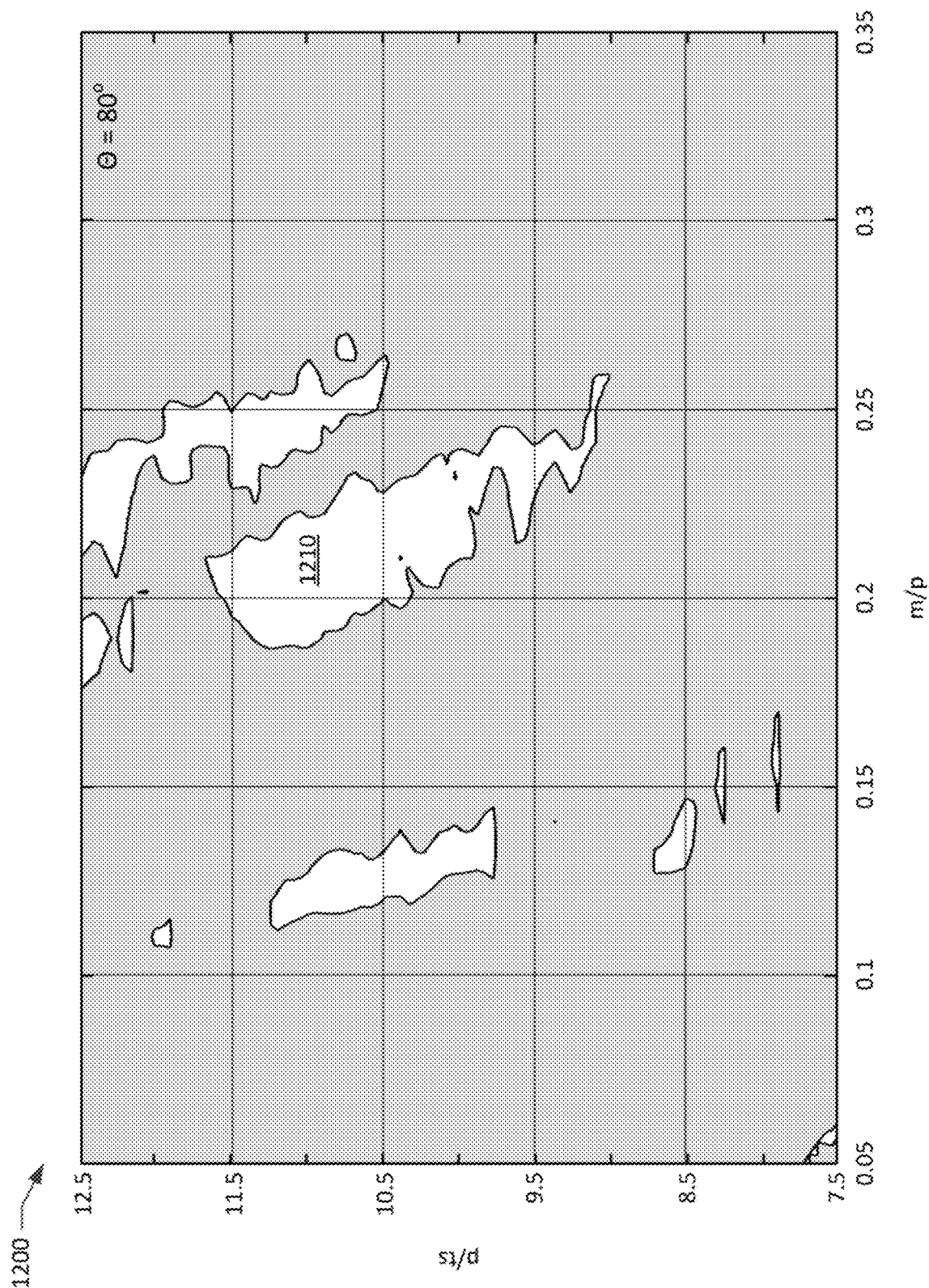
FIG. 12 is a graph identifying preferred combinations of mark and pitch for IDT electrodes with 80° sidewall angles according to an exemplary aspect.
Figure 13:
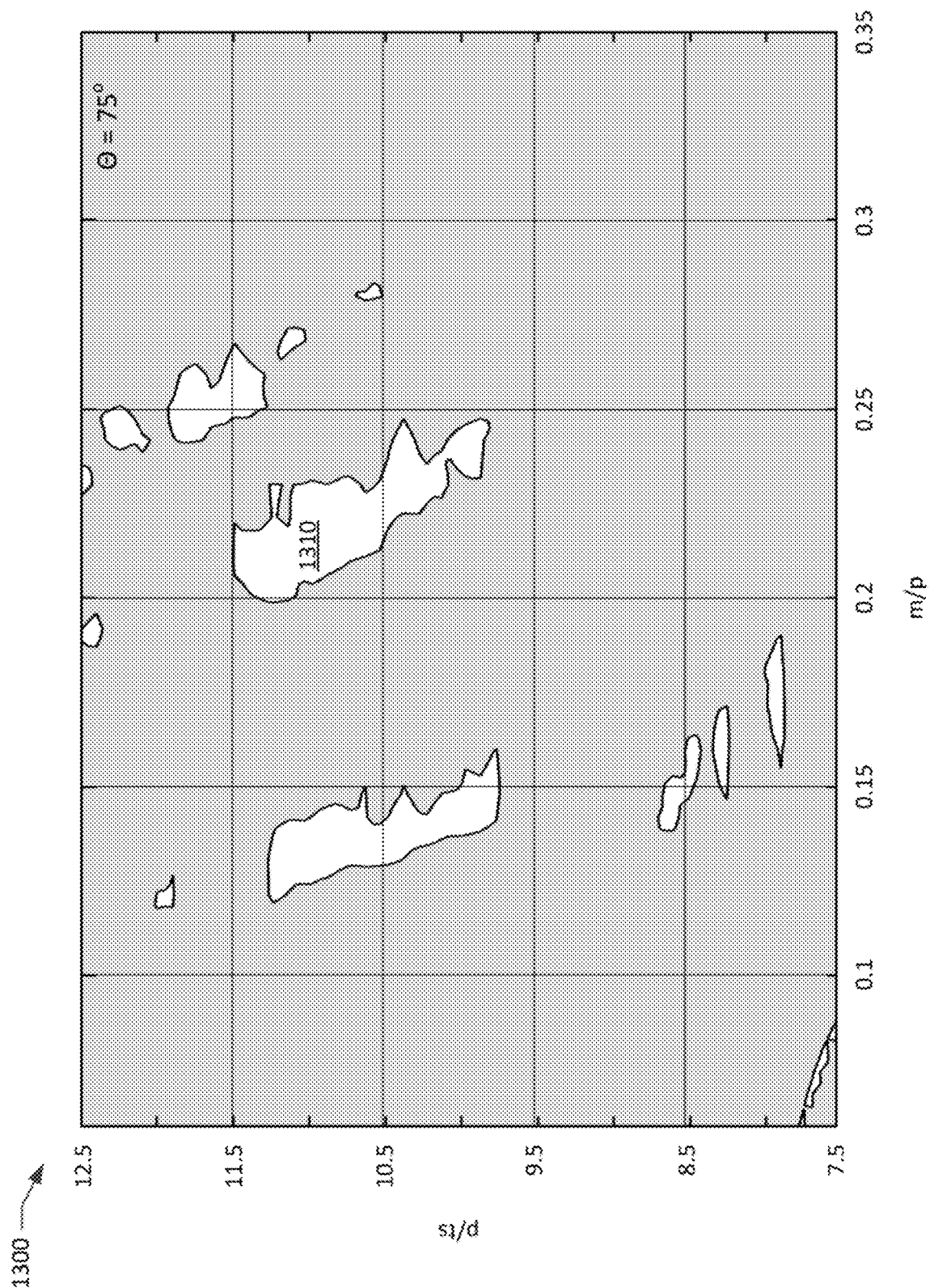
FIG. 13 is a graph identifying preferred combinations of mark and pitch for IDT electrodes with 75° sidewall angles according to an exemplary aspect.
Figure 14:
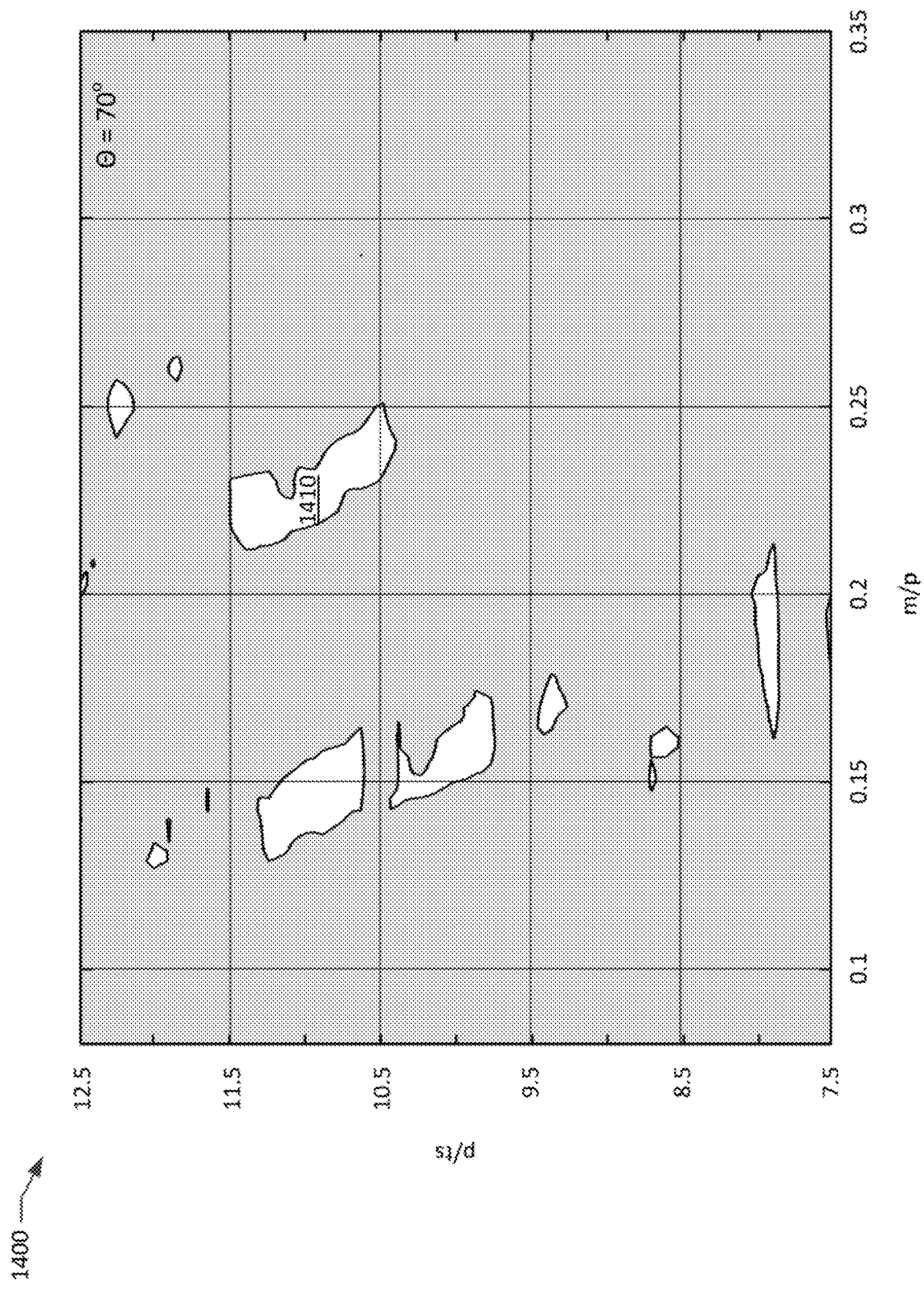
FIG. 14 is a graph identifying preferred combinations of mark and pitch for IDT electrodes with 70° sidewall angles according to an exemplary aspect.

FIG. 10 is a chart 1000 showing combinations of IDT pitch p and IDT finger width or mark m that may provide useable resonators. IDT pitch is normalized to the thickness tp of the piezoelectric plate and the mark m is expressed as a mark-to-pitch ratio m/p. The chart 1000 and all subsequent charts are based on two-dimensional simulations of XBARs with Z-cut lithium niobate diaphragms, aluminum conductors having a thickness 1.25 times the thickness tp of the piezoelectric plate, and no dielectric layers. The chart 1000 is specific to rectangular cross-section IDT fingers with sidewall angle θ=90°. Combinations of IDT pitch and mark falling within unshaded regions, such as region 1010, are likely to have sufficiently low spurious effects to be useful in a target filter. XBARs with IDT pitch and mark within the intervening shaded regions have unacceptably high spurious modes for use in the target filter. With θ=90°, usable resonators exist for IDT pitch values from about 7.7 tp to over 12.5 tp, Useful resonators do not exist for some pitch values within this range.

The resonance and anti-resonance frequencies of an XBAR are primarily determined by the thickness of the diaphragm (115 in FIG. 1) where the IDT fingers are disposed. The pitch of the IDT has small effect on resonance frequency and the width or mark of the IDT fingers has an even smaller effect on resonance frequency. The pitch and mark of the IDT have much stronger effects on the frequency and amplitude of various spurious modes. Having a range of usable IDT pitch and mark values provides a filter designer with degrees of freedom to, for example, ensure that the spurious modes of different resonators within a filter do not coincide. Additionally, while the pitch of an IDT is set by a photomask and can be reproduced very accurately, the mark of the IDT depends to some extent on process parameters. Thus, a filter design must accommodate some variation in mark due to routine manufacturing tolerances.

FIG. 11, FIG. 12, FIG. 13, and FIG. 14 are additional charts (1100, 1200, 1300, 1400 respectively) showing combinations of IDT pitch p and IDT finger width or mark m that may provide useable resonators with sidewall angles of 85°, 80°, 75°, and 70°, respectively. IDT pitch is normalized to the thickness tp of the piezoelectric plate and the mark m is expressed as a mark-to-pitch ratio m/p. In all of these figures, XBARs with IDT pitch and mark-to-pitch ratios within unshaded regions (see, for example regions 1110, 1210, 1310, 1410) may have sufficiently low spurious effects for use in filters. XBARs with IDT pitch and mark-to-pitch ratios within the intervening shaded regions have unacceptably high spurious modes for use in the target filter.

Comparison of FIG. 10, FIG. 11, FIG. 12, FIG. 13, and FIG. 14 shows that useful resonators are available for any specific sidewall angle from 70° to 90°. As sidewall angle θ decreases from 90°, unshaded areas indicating useful resonators shrink slightly and shift towards higher mark-to-pitch ratios. The range of pitch values for useful resonators is about 7.8 tp to 12.5 tp for 85°, 80°, and 75° sidewall angles. With θ=70°, usable resonators exist for IDT pitch values from about 7.9 tp to over 12.3 tp. For any sidewall angle, useful resonators do not exist for some pitch values within the overall range. While the results shown in FIG. 10 through FIG. 14 are specific to a particular structure (piezoelectric material and thickness, electrode thickness, etc.) and FOM algorithm, the general conclusion that useful resonators are available for sidewall angles between 70° and 90° are believed to be valid for other structures and FOM algorithms.

Figure 15:
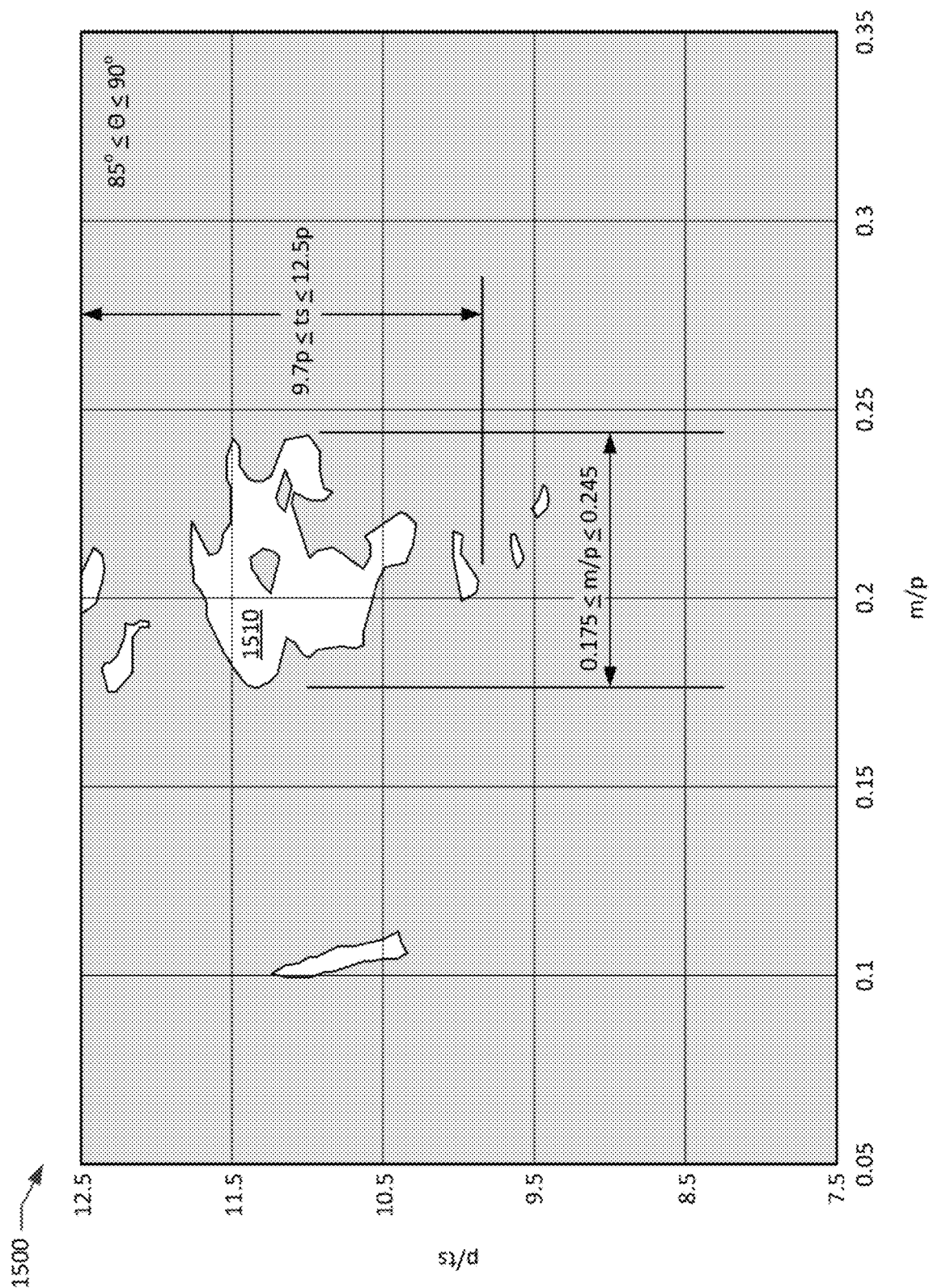
FIG. 15 is a graph identifying preferred combinations of mark and pitch for IDT electrodes with 85° to 90° sidewall angles according to an exemplary aspect.

Since the combinations of IDT pitch and mark that provide useful resonators shift with sidewall angle, it is necessary to control the sidewall angle during production with some tolerance. For example, FIG. 15 is a chart 1500 showing combinations of IDT pitch p and IDT finger mark m that may provide useable resonators with any sidewall angles between 85° and 90°. The unshaded area 1510 identifying useful pitch/mark combinations is significantly smaller than the unshaded areas of FIG. 10 (sidewall angle=90° or FIG. 11 (sidewall angle=85°).

Figure 16:
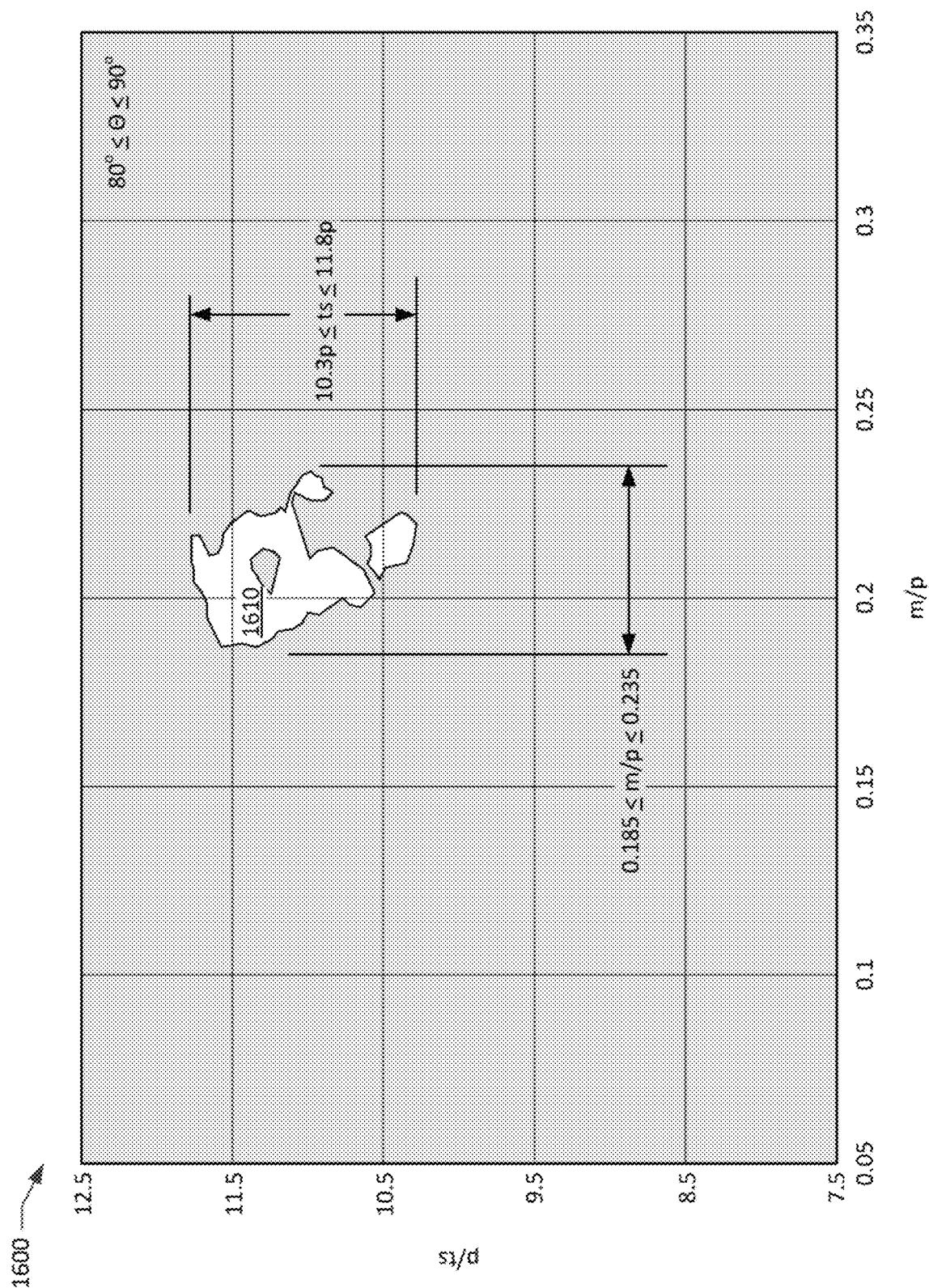
FIG. 16 is a graph identifying preferred combinations of mark and pitch for IDT electrodes with 80° to 90° sidewall angles according to an exemplary aspect.
Figure 17:
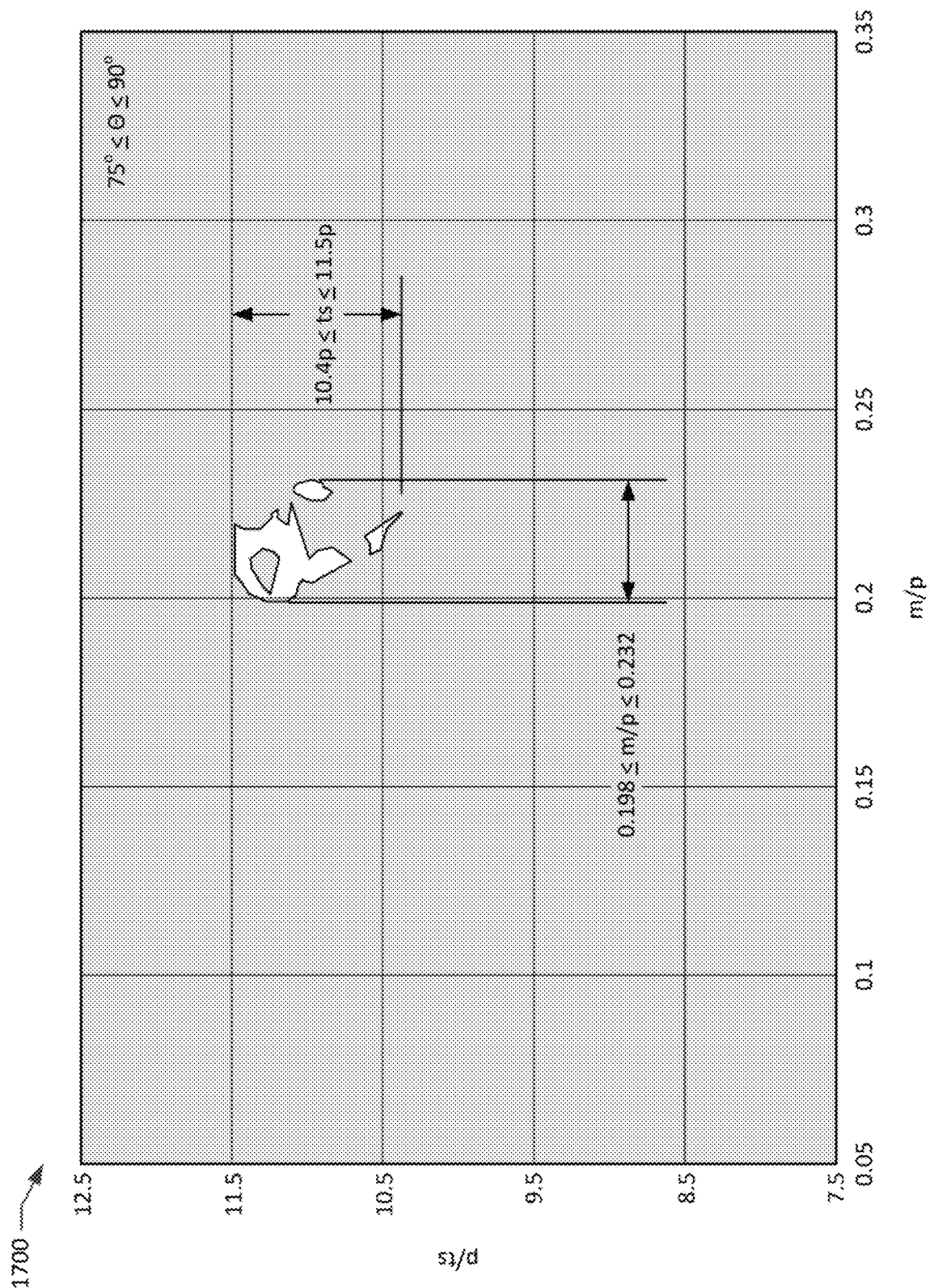
FIG. 17 is a graph identifying preferred combinations of mark and pitch for IDT electrodes with 75° to 90° sidewall angles according to an exemplary aspect.
Figure 18:
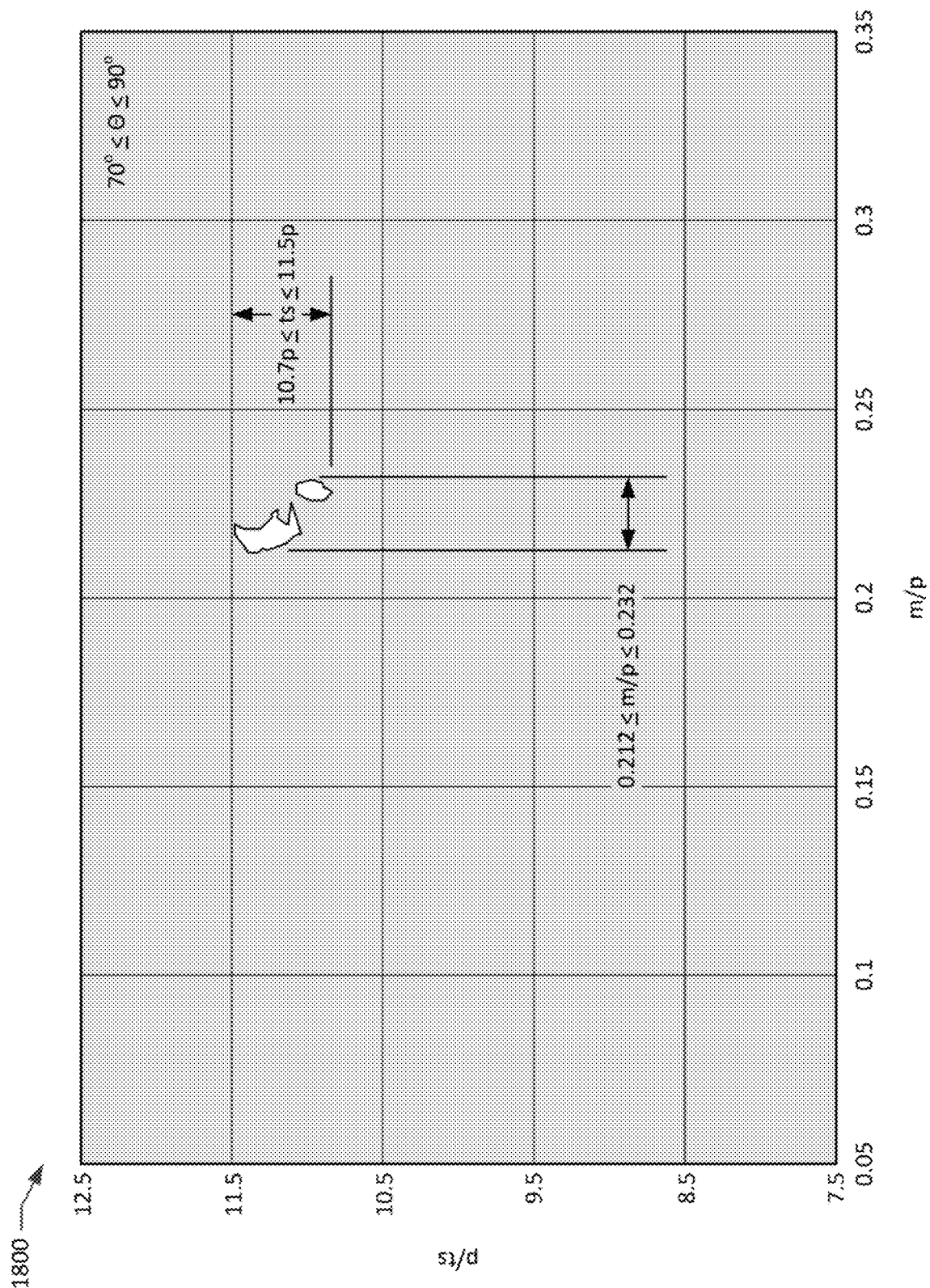
FIG. 18 is a graph identifying preferred combinations of mark and pitch for IDT electrodes with 70° to 90° sidewall angles according to an exemplary aspect.

FIG. 16, FIG. 17, and FIG. 18 are additional charts (1600, 1700, 1800 respectively) showing combinations of IDT pitch p and IDT finger width or mark m that may provide useable resonators with sidewall angles of 80° to 90°, 75° to 90°, and 70° to 90°, respectively. In each case, the unshaded area indicating combinations of IDT pitch p and IDT finger mark m that may provide useable resonators shrinks as the range of possible sidewall angles increases. In particular, the unshaded areas in FIG. 17 and FIG. 18 are very small and may not have sufficient degrees of freedom to design a filter with adequately suppressed spurious modes. It is likely a filter can be designed to accommodate sidewall angles in any 5-degree interval within a range of 70° to 90°, which is equivalent to a manufacturing tolerance of ±2.5 degrees.

Figure 19:
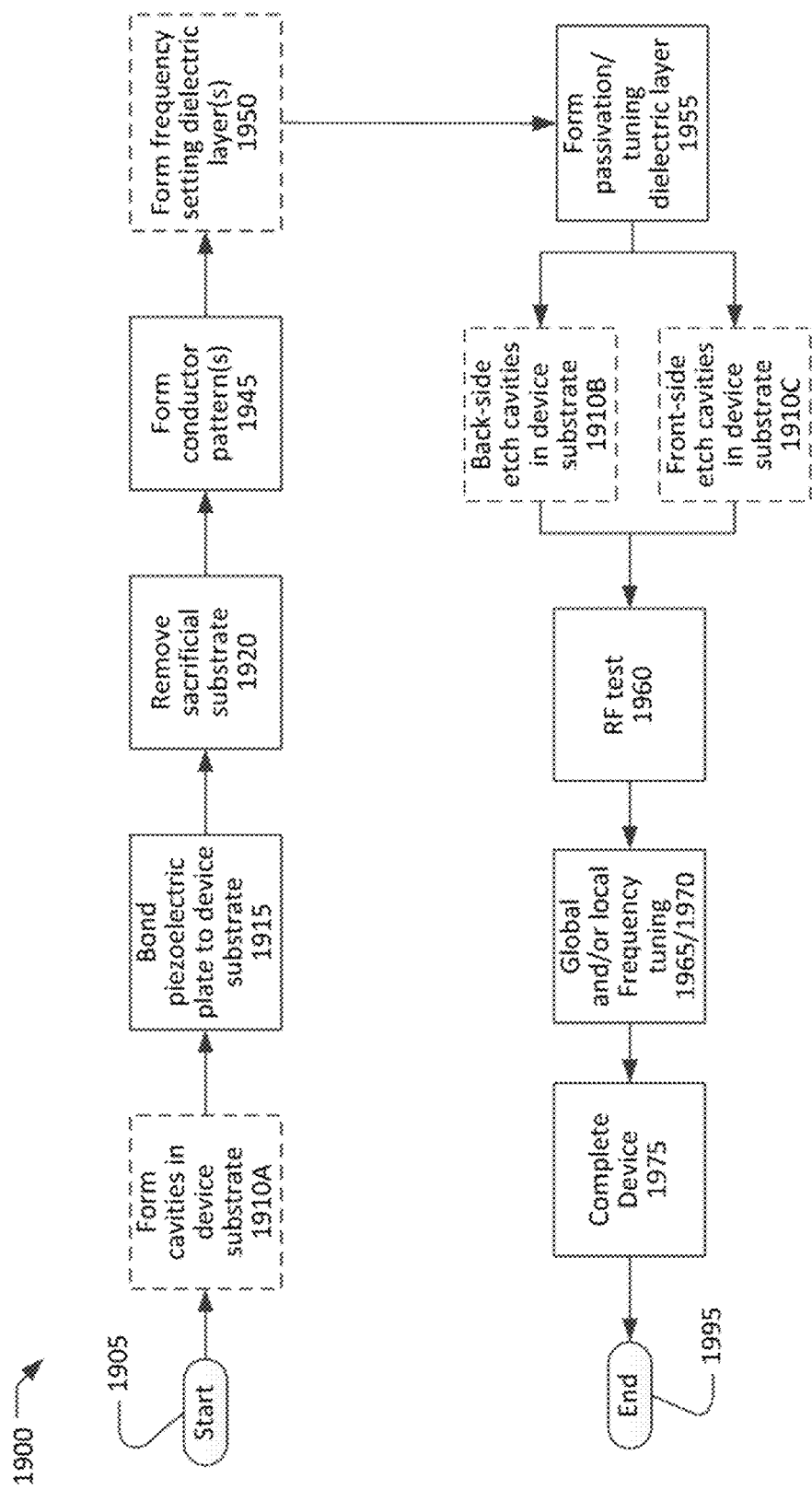
FIG. 19 is a flow chart of a method of making an XBAR according to an exemplary aspect.

FIG. 19 is a simplified flow chart summarizing a process 1900 for fabricating a filter device incorporating XBARs according to an exemplary aspect. Specifically, the process 1900 is for fabricating a filter device including multiple XBARs, some of which may include a frequency setting dielectric layer. The process 1900 starts at 1905 with a device substrate and a thin plate of piezoelectric material disposed on a sacrificial substrate. The process 1900 ends at 1995 with a completed filter device. The flow chart of FIG. 19 includes only major process steps. Various conventional process steps (e.g. surface preparation, cleaning, inspection, baking, annealing, monitoring, testing, etc.) may be performed before, between, after, and during the steps shown in FIG. 19.

While FIG. 19 generally describes a process for fabricating a single filter device, multiple filter devices may be fabricated simultaneously on a common wafer (consisting of a piezoelectric plate bonded to a substrate). In this case, each step of the process 1900 may be performed concurrently on all of the filter devices on the wafer.

The flow chart of FIG. 19 captures three variations of the process 1900 for making an XBAR which differ in when and how cavities are formed in the device substrate. The cavities may be formed at steps 1910A, 1910B, or 1910C. Only one of these steps is performed in each of the three variations of the process 1900.

The piezoelectric plate may be, for example, lithium niobate or lithium tantalate, either of which may be Z-cut, rotated Z-cut, or rotated YX-cut. The piezoelectric plate may be some other material and/or some other cut. The device substrate may preferably be silicon. The device substrate may be some other material that allows formation of deep cavities by etching or other processing.

In one variation of the process 1900, one or more cavities are formed in the device substrate at 1910A, before the piezoelectric plate is bonded to the substrate at 1915. A separate cavity may be formed for each resonator in a filter device. The one or more cavities may be formed using conventional photolithographic and etching techniques. Typically, the cavities formed at 1910A will not penetrate through the device substrate.

At 1915, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 1920, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 1920, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

Thin plates of single-crystal piezoelectric materials laminated to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of $SiO_2$ may be disposed between the piezoelectric plate and the substrate. When a commercially available piezoelectric plate/device substrate laminate is used, steps 1910A, 1915, and 1920 of the process 1900 are not performed.

A first conductor pattern, including IDTs and reflector elements of each XBAR, is formed at 1945 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e., between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 1945 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 1945 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

Forming the first conductor pattern at 1945 includes controlling the sidewall angles of the conductors, or at least the IDT fingers. For example, a nominal sidewall angle may be within a range of 70° to 90°. A tolerance on the sidewall angle may be not less than or equal to ±2.5° from the nominal angle.

At 1950, one or more frequency setting dielectric layer(s) may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 1955, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 1900, the passivation/tuning dielectric layer may be formed after the cavities in the device substrate are etched at either 1910B or 1910C.

In a second variation of the process 1900, one or more cavities are formed in the back side of the device substrate at 1910B. A separate cavity may be formed for each resonator in a filter device. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 1900, one or more cavities in the form of recesses in the device substrate may be formed at 1910C by etching the substrate using an etchant introduced through openings in the piezoelectric plate. A separate cavity may be formed for each resonator in a filter device. The one or more cavities formed at 1910C will not penetrate through the device substrate.

Ideally, after the cavities are formed at 1910B or 1910C, most or all of the filter devices on a wafer will meet a set of performance requirements. However, normal process tolerances will result in variations in parameters such as the thicknesses of dielectric layer formed at 1950 and 1955, variations in the thickness and line widths of conductors and IDT fingers formed at 1945, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 1955. The frequency of a filter device pass-band can be lowered by adding material to the passivation/tuning layer, and the frequency of the filter device pass-band can be increased by removing material to the passivation/tuning layer. Typically, the process 1900 is biased to produce filter devices with pass-bands that are initially lower than a required frequency range but can be tuned to the desired frequency range by removing material from the surface of the passivation/tuning layer.

At 1960, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 1965, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the pass-band of each filter device towards a desired frequency range. The test results from 1960 may be processed to generate a global contour map indicating the amount of material to be removed as a function of two-dimensional position on the wafer. The material is then removed in accordance with the contour map using the selective material removal tool.

At 1970, local frequency tuning may be performed in addition to, or instead of, the global frequency tuning performed at 1965. "Local" frequency tuning is performed with a spatial resolution smaller than an individual filter device. The test results from 1960 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 1965 and/or 1970, the filter device is completed at 1975. Actions that may occur at 1975 include forming bonding pads or solder bumps or other means for making connection between the device and external circuitry (if such pads were not formed at 1945); excising individual filter devices from a wafer containing multiple filter devices; other packaging steps; and additional testing. After each filter device is completed, the process ends at 1995.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

What is claimed:

1. An acoustic resonator device comprising:
   a piezoelectric layer having first and second surfaces; and
   a first electrode and a second electrode on the first surface of the piezoelectric layer, the first and second electrodes and the piezoelectric layer configured such that a radio frequency signal applied between the first and second electrodes excites a primarily primary acoustic mode in the piezoelectric layer, wherein each of the first electrode and the second electrode has a pair of side surfaces that extend from the first surface of the piezoelectric layer, wherein at least one side surface of each pair of side surfaces of each of the first and second electrodes has a sidewall angle that is greater than or equal to 70 degrees and less than 90 degrees or greater than 90 degrees and less than or equal to 110 degrees relative to the first surface of the piezoelectric layer, wherein an average thickness of the piezoelectric layer is less than or equal to a distance between a center of the first electrode and a center of the second electrode.

2. The acoustic resonator device of claim 1, wherein at least one of the first electrode and the second electrode has a trapezoidal or irregular trapezoidal cross-sectional shape that includes the respective pair of side surfaces.

3. The acoustic resonator device of claim 1, wherein the respective sidewall angle of at least one side surface of the first electrode and the respective sidewall angle of at least one side surface of the second electrode are less than 90 degrees.

4. The acoustic resonator device of claim 1, further comprising:
a first busbar to which a plurality of first electrodes is connected; and
a second busbar to which a plurality of second electrodes is connected,
wherein the plurality of first electrodes and the plurality of second electrodes each have a length direction and are interleaved such that the plurality of first electrodes and the plurality of second electrodes face each other in a direction orthogonal to the length direction.

5. The acoustic resonator device of claim 1, further comprising:
a substrate,
wherein the second surface of the piezoelectric layer is disposed on the substrate such that a portion of the piezoelectric layer is a diaphragm that is over a cavity of the acoustic resonator device, and the first electrode and the second electrode are on the diaphragm.

6. The acoustic resonator device of claim 1, further comprising:
a substrate; and
an acoustic Bragg reflector between the second surface of the piezoelectric layer and the substrate.

7. The acoustic resonator device of claim 1, wherein the piezoelectric layer comprises one of lithium niobate and lithium tantalate.

8. An acoustic resonator device comprising:
a piezoelectric layer having first and second surfaces; and
an interdigital transducer (IDT) on the first surface of the piezoelectric layer, the IDT comprising:
first and second busbars,
a first plurality of IDT fingers extending from the first busbar, and
a second plurality of IDT fingers extending from the second busbar and interleaved with the first plurality of fingers,
wherein at least one IDT finger of each of the first plurality of IDT fingers and the second plurality of IDT fingers has a side surface with a sidewall angle that is greater than or equal to 70 degrees and less than 90 degrees or greater than 90 degrees and less than or equal to 110 degrees relative to the first surface of the piezoelectric layer wherein a pitch of the IDT fingers is greater than or equal to 2.5 times a width of the IDT fingers and less than or equal to 10 times the width of the IDT fingers.

9. The device of claim 8, wherein the first plurality of IDT fingers and the second plurality of IDT fingers have a trapezoidal or irregular trapezoidal cross-sectional shape.

10. The device of claim 8, wherein the IDT and the piezoelectric layer are configured such that a radio frequency signal applied between the first and second busbars excites a primarily primary acoustic mode in the piezoelectric layer.

11. The device of claim 8, further comprising a substrate, wherein:
the second surface of the piezoelectric layer is on the substrate such that a portion of the piezoelectric layer forms a diaphragm that is over a cavity of the acoustic resonator device, and
the interleaved IDT fingers are on the diaphragm.

12. The device of claim 8, further comprising:
a substrate; and
an acoustic Bragg reflector between the second surface of the piezoelectric layer and the substrate.

13. The device of claim 8, wherein the device is a shunt resonator in a ladder filter circuit including at least one series resonator.

14. The device of claim 8, wherein the piezoelectric layer is one of lithium niobate and lithium tantalate.

15. An acoustic resonator device comprising:
a piezoelectric layer having a surface; and
an interdigital transducer (IDT) having a plurality of interleaved fingers on the surface of the piezoelectric layer,
wherein at least one finger of the plurality of interleaved finger has a side surface that extends from the surface of the piezoelectric layer,
wherein the side surface of the at least one finger has a sidewall angle relative to the surface of the piezoelectric layer that is greater than or equal to 70 degrees and less than 90 degrees, and
wherein an average thickness of the piezoelectric layer is less than or equal to a pitch of the IDT, the pitch being a center-to-center distance between a pair of adjacent fingers of the plurality of interleaved fingers.

16. The acoustic resonator device of claim 15, wherein the IDT is configured such that a radio frequency signal applied to the IDT excites an acoustic mode in the piezoelectric layer, the acoustic mode being a bulk shear mode where acoustic energy propagates along a direction substantially orthogonal to the surface of the piezoelectric layer, which is normal, to a direction of an electric field created by the interleaved fingers.

17. The acoustic resonator device of claim 15, wherein the at least one finger of the plurality of interleaved finger has a trapezoidal or irregular trapezoidal cross-sectional shape that includes the side surface.

18. The acoustic resonator device of claim 15, wherein the IDT further comprises:
a first busbar to which a plurality of first fingers of the IDT is connected; and
a second busbar to which a plurality of second fingers of the IDT is connected,
wherein the plurality of first fingers and the plurality of second fingers each have a length direction and are interleaved such that the plurality of first fingers and the plurality of second fingers face each other in a direction orthogonal to the length direction.

19. The acoustic resonator device of claim 15, further comprising:
a substrate,
wherein the piezoelectric layer is disposed on the substrate such that a portion of the piezoelectric layer is a diaphragm that is over a cavity of the acoustic resonator device, and the plurality of interleaved fingers are on the diaphragm.

20. The acoustic resonator device of claim 15, further comprising:
a substrate; and
an acoustic Bragg reflector between the piezoelectric layer and the substrate.

21. The acoustic resonator device of claim 15, wherein the piezoelectric layer comprises one of lithium niobate and lithium tantalate.

* * * * *